United States Patent
Yuuya et al.

(10) Patent No.: US 7,544,946 B2
(45) Date of Patent: Jun. 9, 2009

(54) PHOTO-CONDUCTOR, RADIATION DETECTOR, AND RADIATION IMAGING PANEL

(75) Inventors: Shigenori Yuuya, Ashigarakami-gun (JP); Katsuhiro Kohda, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/943,680

(22) Filed: Nov. 21, 2007

(65) Prior Publication Data
US 2008/0116385 A1 May 22, 2008

(30) Foreign Application Priority Data
Nov. 21, 2006 (JP) .............................. 2006-314503

(51) Int. Cl.
*G01T 1/24* (2006.01)

(52) U.S. Cl. .................................. 250/370.08; 250/591
(58) Field of Classification Search ............ 250/370.08, 250/591
See application file for complete search history.

(56) References Cited

U.S. PATENT DOCUMENTS
2005/0214581 A1   9/2005   Kohda et al.

FOREIGN PATENT DOCUMENTS
JP        11237478 A    8/1999
JP      2000249769 A    9/2000

OTHER PUBLICATIONS

S. L. Hou et al., "Transport processes of photoinduced carriers in Bi12SiO20", J. Appl. Phys., Jun. 1973, pp. 2652-2658, vol. 44, No. 6.
B. C. Grabmaier et al., "Properties of Pure and Doped Bi12GeO20 and Bi12SiO20 Crystals", Phys. Stat. Sol. (a)96, 1986, pp. 199-210.
R.E. Aldrich et al., "Electrical and Optical Properties of Bi12SiO20", J. Appl. Phys., 1971, pp. 493-494, vol. 42.
M. T. Santos et al., "Analysis of the Core in Bi12SiO20 and Bi12GeO20 Crystals Grown by the Czochralski Method", Mater. Res. Bull., 1996, pp. 389-396, vol. 31, No. 4.
John Larkin et al., "Hydrothermal growth of Bismuth Silicate (BSO)", J. Crystal Growth, 1993, pp. 871-875, vol. 128.
H. S. Horowitz et al., "Solution Synthesis and Characterization of Sillenite Phases, Bi24M2O40 (M=Si, Ge, V, As, P)", Solid State Ionics, 1989, pp. 678-692, vols. 32/33.

*Primary Examiner*—Constantine Hannaher
(74) *Attorney, Agent, or Firm*—Sughrue Mion, PLLC

(57) ABSTRACT

A photo-conductor, which is adapted for use in constituting a radiation detector and which is capable of forming electric charges by being exposed to radiation, contains $Bi_{12}MO_{20}$, in which M represents at least one kind of element selected from the group consisting of Ge, Si, and Ti. The photo-conductor has characteristics such that a proportion of a diffuse reflectivity at a wavelength of 450 nm with respect to the diffuse reflectivity at a wavelength of 600 nm is equal to at least 75%.

9 Claims, 6 Drawing Sheets

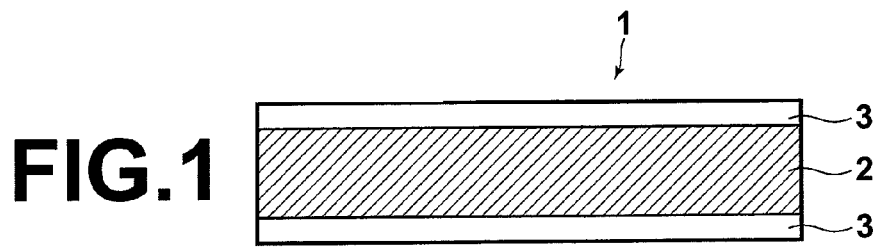
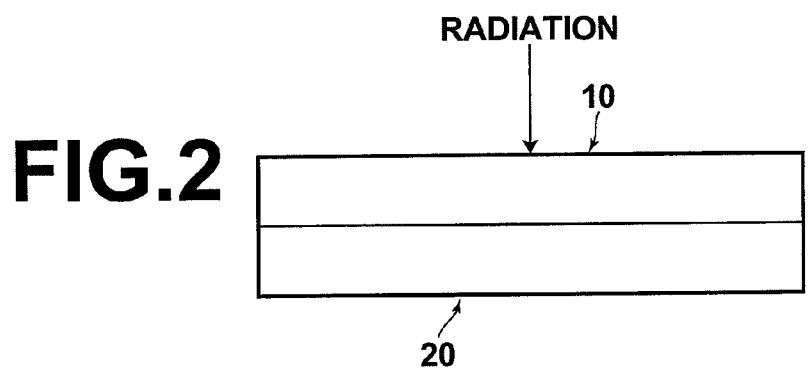
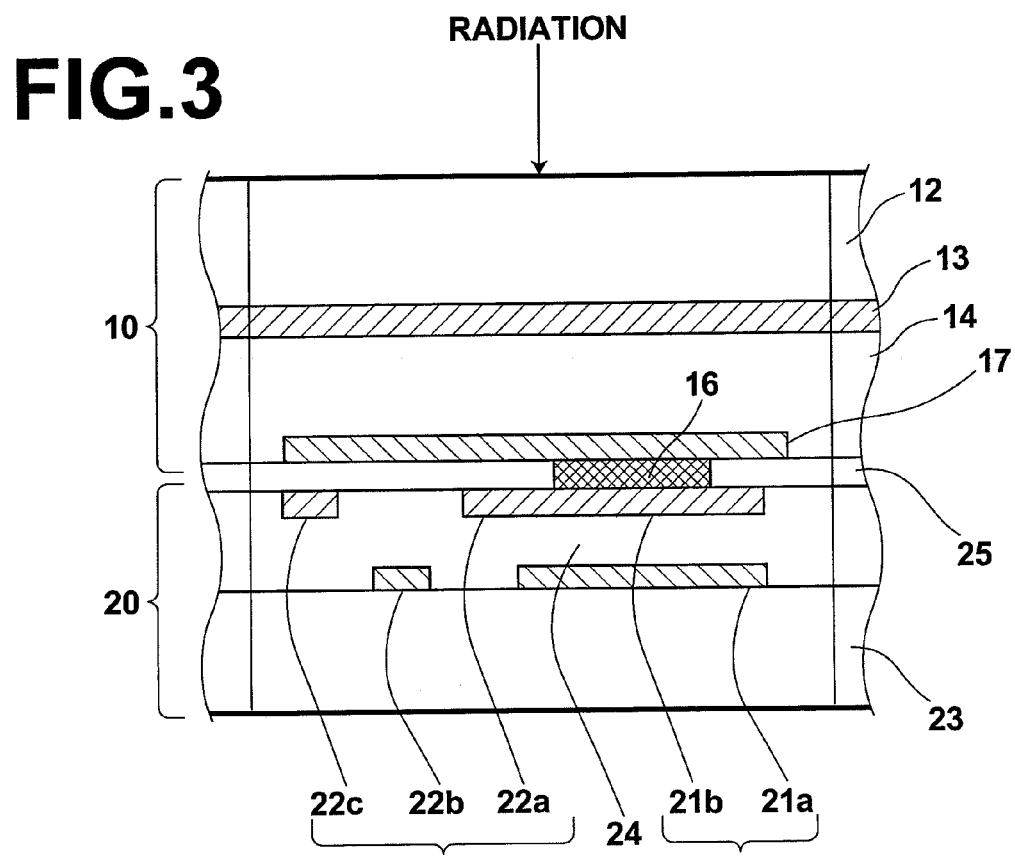

PHOTO-CONDUCTOR, RADIATION DETECTOR, AND RADIATION IMAGING PANEL

BACKGROUND OF THE INVENTION

1. Field of the Invention

This invention relates to a radiation imaging panel adapted for use in a radiation imaging apparatus, such as an X-ray imaging apparatus. This invention particularly relates to a photo-conductor, which may be utilized for constituting the radiation imaging panel.

2. Description of the Related Art

There have heretofore been proposed X-ray imaging panels designed for use in a medical X-ray image recording operation, such that a radiation dose delivered to an object during the medical X-ray image recording operation may be kept small, and such that the image quality of an image and its capability of serving as an effective tool in, particularly, the efficient and accurate diagnosis of an illness may be enhanced. With the proposed X-ray imaging panels, a photo-conductor sensitive to X-rays is employed as a photosensitive material. The photo-conductor is exposed to X-rays carrying X-ray image information, and an electrostatic latent image is thereby formed on the photo-conductor. Thereafter, the electrostatic latent image, which has been formed on the photo-conductor, is read out by use of light or a plurality of electrodes. The techniques utilizing the X-ray imaging panels have advantages over the known photo-fluorography utilizing TV image pickup tubes in that an image is capable of being obtained with a high resolution.

Specifically, when X-rays are irradiated to a charge forming layer located in the X-ray imaging panel, electric charges corresponding to X-ray energy are formed in the charge forming layer. The thus formed electric charges are read out as an electric signal. The photo-conductor described above acts as the charge forming layer. As the material for the photo-conductor, amorphous selenium has heretofore been used. However, ordinarily, amorphous selenium has the problems in that it is necessary for the layer thickness of the photo-conductor to be set to be large (e.g., at least 500 µm) because of a low X-ray absorptivity.

However, if the layer thickness of the photo-conductor is set to be large, the problems will occur in that the speed, with which the electrostatic latent image is read out, becomes low. Also, the problems will occur in that, since a high voltage is applied across the photo-conductor at least during a period from the beginning of the read-out operation after the formation of the electrostatic latent image to the end of the read-out operation, a dark current becomes large, electric charges occurring due to the dark current are added to the latent image charges, and the contrast in a low dose region becomes low. Further, since the high voltage is applied across the photo-conductor, device deterioration is apt to occur, durability becomes low, and electric noise is apt to occur. Furthermore, ordinarily, the photo-conductor is formed with a vacuum evaporation technique. Therefore, considerable time is required to grow the photo-conductor up to the large layer thickness as described above with the vacuum evaporation technique, and management of the growth of the photo-conductor is not easy to perform. As a result, the production cost of the photo-conductor is not capable of being kept low, and the cost of the X-ray imaging panel is not capable of being kept low.

Also, amorphous selenium has toxicity and exhibits a glass transition temperature of approximately 43° C. At temperatures higher than approximately 43° C., amorphous selenium is set in a metastable state, in which crystallization proceeds, and therefore a marked alteration of the characteristics occurs with the passage of time. Accordingly, amorphous selenium has the problems in that particular management is necessary at the time of use and at the time of storage.

Because of the problems described above, it has been studied to utilize materials for the photo-conductor other than amorphous selenium. By way of example, as a substance for constituting the photo-conductor, there has been proposed a bismuth oxide type of composite oxide (sillenite). The proposed bismuth oxide type of the composite oxide may be represented by the formula $Bi_xMO_y$, in which M represents at least one kind of element selected from the group consisting of Ge, Si, and Ti, x represents a number satisfying the condition $10 \leq x \leq 14$, and y represents the stoichiometric oxygen atom number in accordance with M and x. The proposed bismuth oxide type of the composite oxide is described in, for example, each of Japanese Unexamined Patent Publication Nos. 11 (1999)-237478 and 2000-249769. Also, a photo-conductor containing single crystal $Bi_{12}SiO_{20}$ is described in, for example, "Transport processes of photoinduced carriers in $Bi_{12}SiO_{20}$", S. L. Hou et al., J. Appl. Phys., Vol. 44, No. 6, pp. 2652-2658, 1973. Further, single crystal $Bi_{12}GeO_{20}$ and single crystal $Bi_{12}SiO_{20}$ are described in, for example, "Properties of Pure and Doped $Bi_{12}GeO_{20}$ and $Bi_{12}SiO_{20}$ Crystals", B. C. Grabmaier and R. Oberschmid, Phys. Stat. Sol. (a) 96, pp. 199-210, 1986. With each of the proposed bismuth oxide types of the composite oxides, it is expected that the efficiency, with which the X-rays are converted into the electric charges, will be capable of being enhanced.

Furthermore, in, for example, U.S. Patent Application Publication No. 20050214581, there has been proposed a radiation imaging panel using a particle coating film or a sintered film utilizing $Bi_{12}MO_{20}$, in which M represents at least one kind of element selected from the group consisting of Ge, Si, and Ti. It is described therein that, in cases where the photo-conductor takes on the form of a polycrystal, the efficiency with which electric charges having been generated are collected is capable of being enhanced, electric noise is capable of being kept low, and the sensitivity is capable of being enhanced.

As for image formability of the radiation imaging panel, it is necessary for the sensitivity to be enhanced through the enhancement of the electric charge collecting efficiency as described above, and it is markedly important to obtain image stability at the time of iterated image recording and read-out operations. Particularly, in the cases of X-ray images for medical diagnosis, if a ghost or an alteration of gray level gradation contrast arises during the iterated image recording and read-out operations, an erroneous diagnosis will be caused to occur. Therefore, it is important for the ghost and the alteration of gray level gradation contrast to be suppressed.

The image ghost and the alteration of contrast are caused to occur by a decrease of intensity of a signal obtained from a radiation detecting element, which decrease arises due to iterated irradiation of radiation, or by the occurrence of a residual signal after the irradiation of the radiation. As for the photo-conductor constituting the radiation detecting element, the foregoing means that an electric current generated by the irradiation of the radiation alters, and that the electric current at the time other than the irradiation of the radiation alters.

SUMMARY OF THE INVENTION

The primary object of the present invention is to provide a photo-conductor for constituting a radiation detector, wherein problems of a radiation imaging panel with regard to a ghost and an alteration of contrast are capable of being eliminated substantially.

Another object of the present invention is to provide a radiation detector, which comprises the photo-conductor.

A further object of the present invention is to provide a radiation imaging panel, which comprises the photo-conductor.

The present invention provides a first photo-conductor, which is adapted for use in constituting a radiation detector and which is capable of forming electric charges by being exposed to radiation, the photo-conductor containing $Bi_{12}MO_{20}$, in which M represents at least one kind of element selected from the group consisting of Ge, Si, and Ti, the photo-conductor having characteristics such that a proportion of a diffuse reflectivity at a wavelength of 450 nm with respect to the diffuse reflectivity at a wavelength of 600 nm is equal to at least 75%.

The present invention also provides a second photo-conductor, which is adapted for use in constituting a radiation detector and which is capable of forming electric charges by being exposed to radiation, the photo-conductor containing $Bi_{12}MO_{20}$, in which M represents at least one kind of element selected from the group consisting of Ge, Si, and Ti, the photo-conductor having characteristics such that a linear absorption coefficient at a wavelength of 450 nm is equal to at most 10 $cm^{-1}$.

(Hereinbelow, M represents at least one kind of element selected from the group consisting of Ge, Si, and Ti.)

Each of the first and second photo-conductors in accordance with the present invention should preferably be modified such that the photo-conductor is a polycrystal. Ordinarily, the term "polycrystal" means a solid, which is constituted of an aggregate of single crystals having different orientations. Also, the term "polycrystal" as used herein means a solid, in which a plurality of crystal particles taking on the form of the single crystals varying in orientation have been aggregated densely, and in which adjacent crystals have been bonded or bound with one another.

Also, each of the first and second photo-conductors in accordance with the present invention should preferably be modified such that the photo-conductor has been formed with a hydrothermal synthesis technique. Alternatively, each of the first and second photo-conductors in accordance with the present invention should preferably be modified such that the photo-conductor has been formed from particles having been formed with a liquid phase technique. Further, each of the first and second photo-conductors in accordance with the present invention may be modified such that the photo-conductor contains at least one kind of element, which is selected from the group consisting of B, Al, Ga, In, P, As, and Sb, in the form of a solid solution. In such cases, the quantity of the at least one kind of the element, which is selected from the group consisting of B, Al, Ga, In, P, As, and Sb, and which is contained in the form of the solid solution, should preferably fall within the range of 0.02 to 0.4 with respect to M=1 in $Bi_{12}MO_{20}$.

The present invention further provides a radiation detector, comprising:

i) a photo-conductor containing $Bi_{12}MO_{20}$, which photo-conductor has characteristics such that a proportion of a diffuse reflectivity at a wavelength of 450 nm with respect to the diffuse reflectivity at a wavelength of 600 nm is equal to at least 75%, or which photo-conductor has characteristics such that a linear absorption coefficient at a wavelength of 450 nm is equal to at most 10 $cm^{-1}$, and ii) electrodes, which are located on opposite sides of the photo-conductor.

The present invention still further provides a radiation imaging panel, comprising:

i) a photo-conductor, from which electric charges having been formed therein are read out by application of an electric field thereto, ii) a plurality of capacitors for accumulating the electric charges having been formed, which capacitors are arrayed in a planar pattern, and iii) an electronic circuit for reading out the electric charges, which electronic circuit has been combined with the radiation imaging panel into an integral body, wherein the photo-conductor is a photo-conductor containing $Bi_{12}MO_{20}$, which photo-conductor has characteristics such that a proportion of a diffuse reflectivity at a wavelength of 450 nm with respect to the diffuse reflectivity at a wavelength of 600 nm is equal to at least 75%, or which photo-conductor has characteristics such that a linear absorption coefficient at a wavelength of 450 nm is equal to at most 10 $cm^{-1}$.

The present invention also provides a radiation imaging panel, comprising:

a photo-conductor, in which electric charges are formed by application of an electric field thereto, the thus formed electric charges being accumulated as an electrostatic latent image in a charge accumulating layer, the electric charges being read out by irradiation of light to the radiation imaging panel, wherein the photo-conductor is a photo-conductor containing $Bi_{12}MO_{20}$, which photo-conductor has characteristics such that a proportion of a diffuse reflectivity at a wavelength of 450 nm with respect to the diffuse reflectivity at a wavelength of 600 nm is equal to at least 75%, or which photo-conductor has characteristics such that a linear absorption coefficient at a wavelength of 450 nm is equal to at most 10 $cm^{-1}$.

The first photo-conductor in accordance with the present invention, which is adapted for use in constituting the radiation detector and is capable of forming the electric charges by being exposed to radiation, contains $Bi_{12}MO_{20}$ and has the characteristics such that the proportion of the diffuse reflectivity at a wavelength of 450 nm with respect to the diffuse reflectivity at a wavelength of 600 nm is equal to at least 75%. Also, the second photo-conductor in accordance with the present invention, which is adapted for use in constituting the radiation detector and is capable of forming the electric charges by being exposed to radiation, contains $Bi_{12}MO_{20}$, and has the characteristics such that the linear absorption coefficient at a wavelength of 450 nm is equal to at most 10 $cm^{-1}$. Therefore, with each of the first and second photo-conductors in accordance with the present invention, it is possible to suppress the occurrence of a ghost or an alteration of gray level gradation contrast during the iterated image recording and read-out operations. Also, with each of the first and second photo-conductors in accordance with the present invention, it is possible to keep a high electric charge collecting efficiency and good sensitivity.

Accordingly, in cases where the radiation imaging panel in accordance with the present invention is utilized for medical diagnoses, it is possible to suppress erroneous diagnoses due to the occurrence of a ghost or an alteration of gray level gradation contrast during the iterated image recording and read-out operations.

The present invention will hereinbelow be described in further detail with reference to the accompanying drawings.

BRIEF DESCRIPTION OF THE DRAWINGS

FIG. 1 is a sectional view showing an embodiment of the radiation detector in accordance with the present invention, FIG. 2 is an explanatory view showing a radiation detecting section and an active matrix array (AMA) board, which are combined together, in an embodiment of the radiation imaging panel in accordance with the present invention, FIG. 3 is a schematic sectional view showing a constitution at each of radiation detecting sections, each of which corresponds to one pixel.

DETAILED DESCRIPTION OF THE INVENTION

Figure 4:
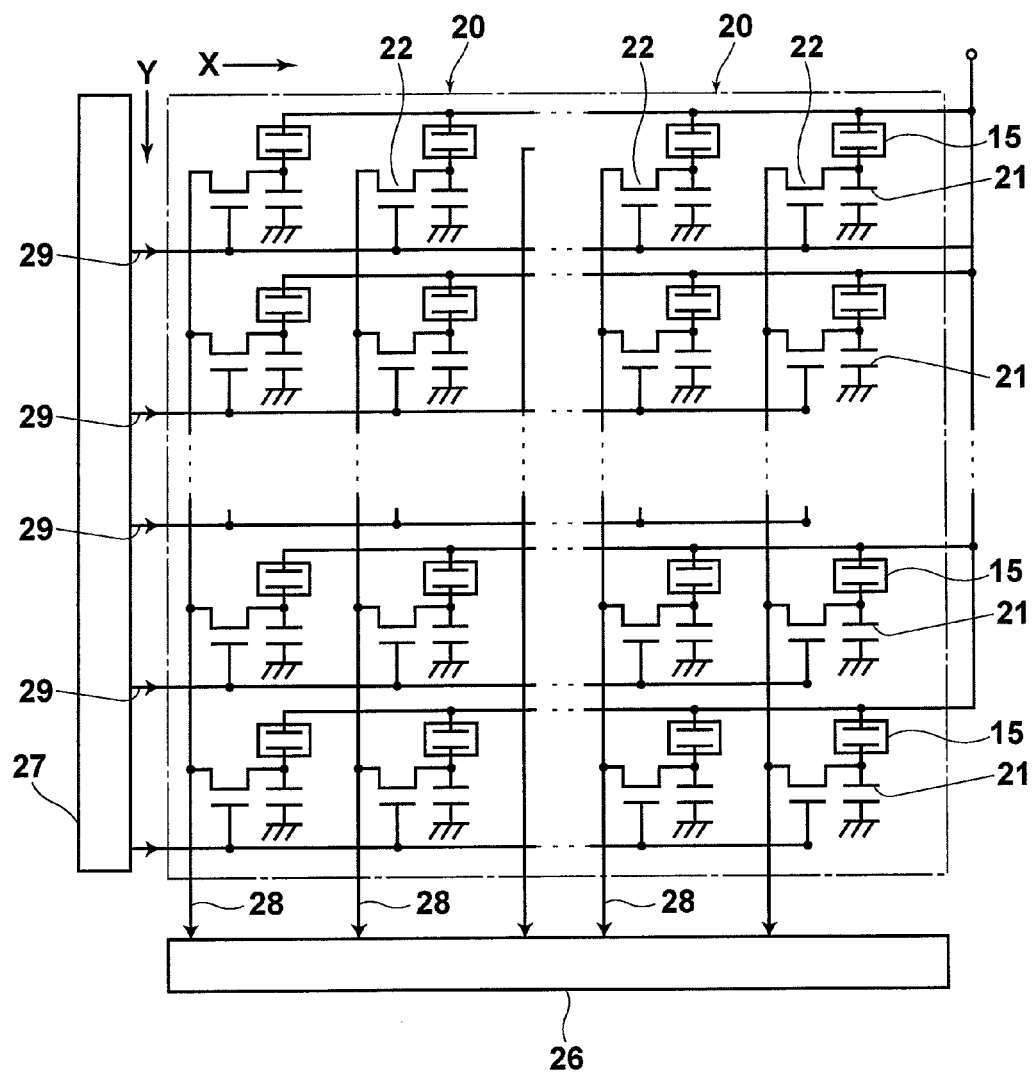
FIG. 4 is an electric circuit diagram showing an equivalent circuit of the AMA board.

The photo-conductor in accordance with the present invention contains $Bi_{12}MO_{20}$, which is the compound having a band gap falling within the range of 3.15 eV to 3.25 eV. The $Bi_{12}MO_{20}$ compound has an optical absorption edge at a wavelength falling within the range of 380 nm to 390 nm. Also, it has been known that the $Bi_{12}MO_{20}$ compound exhibits a light yellow color and exhibits optical absorption in a visible blue region. (Reference may be made to "Electrical and Optical Properties of $Bi_{12}SiO_{20}$", R. E. Aldrich et al., J. Appl. Phys., Vol. 42, pp. 493-494, 1971.)

Further, it has been reported that, in cases where the Bi/M composition ratio in the $Bi_{12}MO_{20}$ compound is high, the compound exhibits a deep yellow color. It has also been reported that the yellow coloring is caused to occur by the Bi element (i.e., an anti-site Bi element), which is located at the M site in the crystal structure. (Reference may be made to "ANALYSIS OF THE CORE IN $Bi_{12}SiO_{20}$ and $Bi_{12}GeO_{20}$ CRYSTALS GROWN BY THE CZOCHRALSKI METHOD", M. T. Santos et al., Mater. Res. Bull., Vol. 31, pp. 389-396, 1996.) Therefore, the anti-site Bi defect described above forms an inter-band level falling within the range of 2.5 eV to 3 eV, which inter-band level corresponds to an optical wavelength (falling within the range of 400 nm to 500 nm) in the visible blue region.

The photo-conductor, in which the concentration of the inter-band level based upon the crystal defect described above, is the photo-conductor in accordance with the present invention. Radiation has photon energy markedly higher than the band gap and energy corresponding to visible light. In cases where the radiation is irradiated to the photo-conductor, electrons of a valence band are excited to a conduction band, and electron-positive hole pairs are thus formed. Though details of the inter-band level are not clear, in the cases of a donor site, conduction electrons, which have been excited by the radiation to the conduction band, and localized positive holes are formed. Also, in the cases of an acceptor site, deep electron traps are formed.

The localized positive holes or the trapped electrons form space charges. Since the absorption of the radiation and the formation of the electron-positive hole pairs arise primarily on the side of a radiation irradiation surface, an internal electric field in the direction of the irradiation is caused to alter by the irradiation of the radiation. Therefore, it is considered that the quantities of the electrons and the positive holes, which are conducted by the electric field and arrive at pole plates, alter.

Specifically, since collected electric current alters in accordance with high dose irradiation and iterated irradiation of the radiation, the electric current at an identical radiation dose rate or the total electric charges formed (calculated by electric current integration) at an identical radiation dose also alter. Also, in the cases of the radiation imaging panel, a plurality of the radiation detectors, each of which corresponds to one pixel, are arrayed the planar pattern, and a gray level image is formed with the electric current or the electric charges obtained from each of the radiation detectors. In such cases, in each of the radiation detectors, the collected electric current alters in accordance with the high dose irradiation and the iterated irradiation of the radiation. As a result, the ghost or the contrast alteration is caused to occur.

As described above, the photo-conductor in accordance with the present invention should preferably be such that the concentration of the inter-band level based upon the anti-site Bi crystal defect is low. The low concentration of the inter-band level based upon the anti-site Bi crystal defect is equivalent to little optical absorption in the blue region.

In the cases of the optical reflection, the relationship between the diffuse reflectivity and the optical absorption may be represented by Formula (1) shown below in accordance with the Kubelka-Munk's law.

$$\frac{(1-R)^2}{2R} = \frac{\alpha}{S'} \quad (1)$$

$$\therefore R = \frac{I}{I_0}$$

wherein R represents the diffuse reflectivity, I represents the intensity of the diffuse reflected light, $I_0$ represents the intensity of the incident light, $\alpha$ represents the linear absorption coefficient, and S' represents the scattering coefficient.

The scattering coefficient varies in accordance with scattering factors, such as the roughness of a sample surface and voids located within the sample, and is not always capable of being determined quantitatively. However, the scattering coefficient undergoes little alteration with respect to the light wavelength and is capable of being kept at a predetermined value. Therefore, with spectral analysis of the reflected light, it is possible to find the alteration of the linear absorption coefficient in accordance with the light wavelength.

The inter-band level based upon the anti-site Bi crystal defect to be discussed herein falls within the range of 2.5 eV to 3 eV and corresponds to the optical wavelength falling within the range of 400 nm to 500 nm. In an optical reflection spectrum, the reflectivity with respect to the wavelengths outside the range described above (e.g., the reflectivity with respect to the wavelength of at most 390 nm, which is the optical absorption edge wavelength, or the reflectivity with respect to the wavelength of at least 600 nm, which is the optical absorption edge wavelength) is not based upon the absorption due to the defect described above and is principally based upon the effect of the scattering coefficient of the sample. Examples of the other kinds of the crystal defects, which cause the optical absorption to arise, include an oxygen defect and an impurity level. For example, the oxygen defect often causes the optical absorption to occur over the entire visible region. Also, the impurity level causes the absorption to occur with respect to a specific wavelength. In order for the defect due to the anti-site Bi to be determined quantitatively, while the effects of the scattering coefficient and the other kinds of the crystal defects upon the reflectivity are being ignored, there may be employed a technique, in which a relative reflectivity having been normalized with a reflectivity with respect to a wavelength exceeding the absorption range of 400 nm to 500 nm is utilized. Therefore, the proportion of the diffuse reflectivity at a wavelength of 450 nm with respect to the diffuse reflectivity at a wavelength of 600 nm is capable of being taken as the relative concentration of the anti-site Bi defect in comparison between samples having different scattering coefficients.

The photo-conductor in accordance with the present invention is characterized by containing $Bi_{12}MO_{20}$ and having the characteristics such that the proportion of the diffuse reflectivity at a wavelength of 450 nm with respect to the diffuse reflectivity at a wavelength of 600 nm is equal to at least 75%. The diffuse reflection embraces the reflected light having been scattered at angles other than the regular reflection angles. The diffuse reflectivity is defined by the formula (Ia+Ib)/$I_0$I, wherein Ia represents the intensity of the regular reflected light, Ib represents the intensity of the scattered light other than the regular reflected light, I represents the intensity of the diffuse reflected light, and $I_0$ represents the intensity of the incident light. Since the value of Ia+Ib is the total sum of the intensity of the reflected light at arbitrary angles, the value of Ia+Ib is capable of being measured by use of a spectroscope provided with an integrating sphere. If the proportion of the diffuse reflectivity at a wavelength of 450 nm with respect to the diffuse reflectivity at a wavelength of 600 nm is lower than 75%, the concentration of the inter-band level based upon the anti-site Bi crystal defect will become high, and the optical absorption in the blue region will become high. Therefore, it will not always be possible to suppress the sensitivity alteration rate at a low value during the iterated image recording and read-out operations. Also, it will not always be possible to suppress the occurrence of the ghost and the alteration of the gray level gradation contrast. In cases where the proportion of the diffuse reflectivity at a wavelength of 450 nm with respect to the diffuse reflectivity at a wavelength of 600 nm is high, the concentration of the inter-band level becomes low. Therefore, the proportion of the diffuse reflectivity at a wavelength of 450 nm with respect to the diffuse reflectivity at a wavelength of 600 nm should preferably be as high as possible.

The relationship between the light transmittance and the optical absorption may be represented by Formula (2) shown below in accordance with the Lambert-Beer's law.

$$\frac{I}{I_0} = A \cdot \exp\{-(\alpha + S)t\} \quad (2)$$

$$\therefore A = (1-X)^2, X = \left(\frac{n-1}{n+1}\right)^2$$

wherein I represents the intensity of the transmitted light, $I_0$ represents the intensity of the incident light, $\alpha$ represents the linear absorption coefficient, S represents the internal scattering coefficient, t represents the thickness, and n represents the refractive index.

In the cases of a polycrystal, voids within the sample or the occurrence of birefringence constitute scattering factors. Therefore, in such cases, it is not always possible for the internal scattering coefficient to be determined quantitatively. In cases where the internal scattering coefficient is large, the intensity of the transmitted light attenuates markedly, and therefore the measurement accuracy is not capable of being kept high.

However, the photo-conductor in accordance with the present invention contains the $Bi_{12}MO_{20}$ material, which has the cubic crystal system and does not exhibit the birefringence. Therefore, in such cases, as for the transparent polycrystal film and the single crystal film, which are free from voids acting as the internal scattering factor, the internal scattering coefficient is capable of being regarded as being zero. Accordingly, in cases where the surface of the sample is formed as an optical specular surface, and the transmittance and the sample thickness are thus measured, the linear absorption coefficient which the photo-conductor originally has is capable of being calculated from the transmittance and the sample thickness having thus been measured. Since the absorption wavelength range based upon the anti-site Bi crystal defect to be discussed herein is from 400 nm to 500 nm, the linear absorption coefficient with respect to a wavelength of 450 nm, which is the center wavelength of the absorption wavelength range described above has a correlation with the concentration of the anti-site Bi defect.

The photo-conductor in accordance with the present invention is characterized by having the characteristics such that the linear absorption coefficient at a wavelength of 450 nm is equal to at most 10 cm$^{-1}$. The calculation of the linear absorption coefficient has been made by use of Formula (2) shown above, and the refractive index at a wavelength of 450 nm has been taken as n=2.73 in accordance with the literature ("Electrical and Optical Properties of $Bi_{12}SiO_{20}$", R. E. Aldrich et al., J. Appl. Phys., Vol. 42, pp. 493-494, 1971). If the linear absorption coefficient at a wavelength of 450 nm is larger than 10 cm$^{-1}$, the concentration of the inter-band level based upon the anti-site Bi crystal defect will be come high, and the optical absorption in the blue region will become high. Therefore, it will not always be possible to suppress the sensitivity alteration rate at a low value during the iterated image recording and read-out operations. Also, it will not always be possible to suppress the occurrence of the ghost and the alteration of the gray level gradation contrast. In cases where the linear absorption coefficient at a wavelength of 450 nm is small, the concentration of the inter-band level becomes low. Therefore, the linear absorption coefficient at a wavelength of 450 nm should preferably be as small as possible.

The photo-conductor in accordance with the present invention is capable of being obtained with the hydrothermal synthesis technique. The hydrothermal synthesis technique is the technique, in which crystal growth is performed in an aqueous solution at a high temperature and a high pressure. An example of the hydrothermal synthesis technique is described in "Hydrothermal growth of bismuth silicate (BSO)", J. Larkin et al., J. Crystal Growth, Vol. 128, pp. 871-875, 1993 or U.S. Pat. No. 5,322,591.

Specifically, with the hydrothermal synthesis technique, a raw material and a seed crystal may be located within an autoclave, the raw material having been dissolved in an aqueous solution may be caused to undergo deposition on the seed crystal, and a film of the raw material may thereby be formed on the seed crystal. As the raw material, it is possible to use previously synthesized $Bi_{12}MO_{20}$ in the state of particles or a bulk material. Alternatively, as the raw material, it is possible to use a mixture of $Bi_2O_3$ and $GeO_2$, $SiO_2$, or $TiO_2$ in a Bi/M molar ratio falling within the range of 11 to 13.

As the seed crystal, it is possible to utilize the single crystal or the polycrystal of $Bi_{12}MO_{20}$. As the polycrystal acting as the seed crystal, a sintered simple substance may be employed. Alternatively, $Bi_{12}MO_{20}$ having been formed into a film on a base plate with a CVD technique, a PVD technique, or the like, may be employed as the polycrystal acting as the seed crystal. As another alternative, the polycrystal acting as the seed crystal may be prepared with processing, wherein $Bi_{12}MO_{20}$ particles are formed into a film on a base plate with a screen printing technique, a doctor blade technique, or the like, and wherein the thus formed film of the $Bi_{12}MO_{20}$ particles is sintered. The base plate utilized in such cases may be made from an arbitrary material, which does not undergo reaction with the aqueous solution at high temperatures and high pressures. Examples of materials appropriate for the base plate include alumina, aluminum nitride, silicon carbide, silicon nitride, noble metals (Au, Ag, Pt, Pd, Rh, Ir, Ru, and Os), and alloys of the noble metals. In cases where the base plate made from a material, which is other than the noble metals and the alloys of the noble metals, is employed, the problems will often be encountered in that the $Bi_{12}MO_{20}$ nucleus formation and growth on the base plate arise and in that dissolution of the material of the base plate arises. Therefore, in cases where the base plate made from a material, which is other than the noble metals and the alloys of the noble metals, is employed, the regions of the surfaces of the base plate other than the base plate region coated with the seed crystal should preferably be coated with a noble metal or an alloy of the noble metal.

The aqueous solution for dissolving the raw material should preferably be an alkaline aqueous solution. By way of example, the aqueous solution for dissolving the raw material may be an aqueous LiOH solution, an aqueous NaOH solution, an aqueous KOH solution, or an aqueous ammonia solution. The concentration of the aqueous solution should preferably fall within the range of approximately 2N to approximately 6N, and should more preferably fall within the range of approximately 4N to approximately 5N.

A hydrothermal synthesis film is capable of being obtained under the growth conditions such that the temperature at the raw material region is set so as to fall within the range of 300° C. to 500° C., and such that the temperature at the deposition region on the seed crystal is set at a value lower by 0° C. to 50° C. than the temperature at the raw material region. In cases where the temperature at the raw material region is high, or in cases where the difference in temperature between the raw material region and the deposition region on the seed crystal is large, the rate with which the film is formed becomes high, and the denseness of the obtained film is apt to become low. The temperature at the raw material region should preferably be set so as to fall within the range of 380° C. to 420° C., and the temperature at the deposition region on the seed crystal should preferably be set at a value lower by 5° C. to 10° C. than the temperature at the raw material region. In such cases, a denser film is capable of being obtained.

The autoclave may have a strength capable of enduring a high temperature and a high pressure. An inner wall of the autoclave may be made from an arbitrary material, which does not undergo reaction with the aqueous solution. By way of example, the autoclave may have a stainless steel inner wall provided with lining with a noble metal, such as Pt or Ag. Also, the autoclave should preferably be provided with a baffle (a perforated plate), which is located at an intermediate region within the autoclave. The baffle acts to suppress convection of the aqueous solution, which convection is caused to occur by the difference in temperature between the raw material region and the seed crystal region.

The photo-conductor in accordance with the present invention is capable of being obtained with the processing, wherein the $Bi_{12}MO_{20}$ particles are formed previously, and wherein the polycrystal photo-conductor is formed by use of the $Bi_{12}MO_{20}$ particles having been formed previously. In such cases, as the $Bi_{12}MO_{20}$ particles to be used, the $Bi_{12}MO_{20}$ particles having been synthesized with the liquid phase technique should preferably be employed. The liquid phase synthesis technique is the technique, in which the particle formation is performed in an aqueous solution. The liquid phase synthesis technique is described in, for example, "SOLUTION SYNTHESIS AND CHARACTERIZATION OF SILLENITE PHASES, $Bi_{24}M_2O_{40}$(M=Si, Ge, V, As, P)", H. S. Horowitz et al., Solid State Ionics, Vols. 32/33, pp. 678-690, 1989.

With the liquid phase synthesis technique for the formation of the particles, a raw material solution containing the Bi constituent and a raw material solution containing the M constituent are mixed with each other in an alkaline aqueous solution having a pH value of at least 11, and the $Bi_{12}MO_{20}$ particles are thereby caused to be deposited in the liquid. The $Bi_{12}MO_{20}$ particles having been deposited at the room temperature are amorphous particles. However, in cases where the temperature is kept to be at least 50° C. at the time of the mixing and at the time after the mixing, crystalline particles are capable of being obtained. The $Bi_{12}MO_{20}$ particles having thus been obtained with the liquid phase technique may then be sintered, and the polycrystal photo-conductor is thus capable of being obtained.

Specifically, the alkaline aqueous solution is prepared as the deposition medium. Examples of the alkaline aqueous solutions include an aqueous LiOH solution, an aqueous NaOH solution, an aqueous KOH solution, and an aqueous CsOH solution. The alkali concentration should preferably fall within the range of 1N to 2N. As the Bi raw material solution, there should preferably be utilized a solution, in which bismuth oxide ($Bi_2O_3$) or bismuth nitrate ($Bi(NO_3)_3 \cdot 5H_2O$) has been dissolved in a nitric acid solution. Also, as the M element raw material solution, in cases where M represents Si, it is possible to utilize an aqueous solution of a silicate, or an alkaline aqueous solution of an alkoxide, such as triethoxysilane ($Si(OC_2H_5)_4$). Further, as the M element raw material solution, in cases where M represents Ge, it is possible to utilize a solution, in which germanium oxide ($GeO_2$) has been dissolved in a nitric acid solution, or an alkaline aqueous solution of an alkoxide, such as triethoxygermanium ($Ge(OC_2H_5)_4$). Furthermore, as the Ti raw material solution, it is possible to utilize an alkaline aqueous solution of an alkoxide, such as tetraisopropoxytitanium ($Ti(OC_3H_7)_4$).

In order for the raw material solutions to be mixed with the alkaline solution, the raw material solutions may be introduced simultaneously into the alkaline solution. Alternatively, in cases where the M raw material solution is an acidic solution, the Bi raw material liquid and the M raw material solution may be previously mixed together in predetermined concentrations, and the resulting mixture may be introduced into the alkaline solution acting as the deposition medium. As another alternative, in cases where the M raw material solution is an alkaline solution, the M raw material solution may be previously mixed with the alkaline solution acting as the deposition medium, and the Bi raw material liquid may be introduced into the resulting mixture. The temperature at which the mixing processing is performed may be the room temperature. In cases where the crystalline particles are to be obtained, the temperature after the solution introduction may be kept to be at least 50° C., preferably at a temperature falling within the range of 70° C. to 80° C., for several hours.

In cases where the particles having been deposited after the mixing processing are to be recovered, decantation or filtering is performed by use of deionized water in order to remove the alkali metal constituent. Thereafter, the particles having been recovered are dried with the ordinary technique.

As a technique for producing the polycrystal photo-conductor by use of the particles having been obtained in the manner described above, the particles may be molded into a film form with pressing processing, and the thus obtained film may then be sintered. As the technique for molding into the film form, a green sheet technique, or the like, may be employed. Also, in order for the sintering density to be enhanced, a hot press sintering technique, which is performed with the application of a uniaxial pressure, a hot isostatic pressing (HIP) technique, which is performed with the application of a hydrostatic pressure, or the like, may be combined with a known technique at the time of the sintering processing.

As a technique for obtaining the film-form photo-conductor directly from the particles, an aerosol deposition technique may be employed. The aerosol deposition technique is the technique, in which the particle raw material is mixed with a carrier gas and is thus formed into an aerosol, the obtained aerosol is jetted out from a nozzle against a base plate, and a film is thereby formed on the base plate. With the aerosol deposition technique, the film-form polycrystal is capable of being obtained without a high-temperature particle sintering process being used.

The photo-conductor in accordance with the present invention should preferably contain an element, which forms trivalent ions or pentavalent ions, in the form of the solid solution in the $Bi_{12}MO_{20}$ crystal. The term "solid solution" as used herein means that the solid solution forming element is present in the form of the ions within the crystal, such that the $Bi_{12}MO_{20}$ crystal may not alter the crystal structure. The solid solution forming element has the effects of suppressing the concentration of the anti-site Bi defect described above. Examples of the preferable solid solution forming elements include B, Al, Ga, In, P, As, and Sb. Each of the above-enumerated solid solution forming elements may be contained alone, or the above-enumerated solid solution forming elements may be contained in combination.

In order for the concentration of the anti-site Bi defect to be suppressed more efficiently, a substitutional solid solution should preferably be formed with respect to the M element in $Bi_{12}MO_{20}$. The quantity of the solid solution forming element, which is contained in the form of the substitutional solid solution, should preferably fall within the range of 0.02 to 0.4 with respect to M=1 in $Bi_{12}MO_{20}$. If the quantity of the solid solution forming element, which is contained in the form of the substitutional solid solution, is smaller than 0.02 with respect to M=1 in $Bi_{12}MO_{20}$, the effects of the formation of the substitutional solid solution will not be kept large. If the quantity of the solid solution forming element, which is contained in the form of the substitutional solid solution, is larger than 0.4 with respect to M=1 in $Bi_{12}MO_{20}$, it will not always be possible to obtain the desired single-phase $Bi_{12}MO_{20}$ compound. In order for the effects of the formation of the substitutional solid solution to be enhanced even further, the quantity of the solid solution forming element, which is contained in the form of the substitutional solid solution, should preferably be at least 0.05 with respect to M=1 in $Bi_{12}MO_{20}$. In cases where the quantity of the solid solution forming element, which is contained in the form of the substitutional solid solution, becomes larger than 0.15 with respect to M=1 in $Bi_{12}MO_{20}$, the lattice strain of the crystal will become large due to the difference in ionic radius, and the crystalline characteristics will become bad. Also, in such cases, the defects other than the anti-site Bi defect will be apt to occur, and the radiation detection characteristics will not be capable of being kept good. Therefore, the quantity of the solid solution forming element, which is contained in the form of the substitutional solid solution, should more preferably be equal to at most 0.15 with respect to M=1 in $Bi_{12}MO_{20}$.

In such cases, the photo-conductor may be produced with the hydrothermal synthesis technique described above. Alternatively, the photo-conductor may be produced with the processing, in which the particles having been obtained with the liquid phase technique are processed for forming the polycrystal. As another alternative, the photo-conductor may be produced with one of other techniques. In cases where the hydrothermal synthesis technique is to be employed, the processing may be performed with the procedure described above, and the necessary raw material may be added. As the raw material, the $Bi_{12}MO_{20}$ material, which takes on the form of the particles or the bulk material, and which contains at least one kind of the solid solution forming element selected from the group consisting of B, Al, Ga, In, P, As, and Sb, may be employed. In cases where the processing, in which the particles are formed with the liquid phase technique, is to be employed, a solution, which contains at least one kind of the solid solution forming element selected from the group consisting of B, Al, Ga, In, P, As, and Sb, may be prepared besides the Bi raw material solution and the M element raw material solution, and the predetermined quantities of the solutions having been prepared may be introduced into the alkali liquid. Alternatively, at least one kind of the solid solution forming element selected from the group consisting of B, Al, Ga, In, P, As, and Sb may be previously mixed in a predetermined concentration with the M element raw material solution.

Examples of the techniques for directly producing the film-form photo-conductor in a way other than the hydrothermal synthesis technique include a melting and solidifying technique, a sol-gel technique, a chemical liquid phase technique, the CVD technique, and the PVD technique. As a further alternative, besides the formation of the particles with the liquid phase technique, the film-form photo-conductor may be produced with the processing, in which the particles are synthesized with a simpler solid phase reaction technique and are then sintered.

The synthesis of the particles with the solid phase reaction technique may be performed by use of one of various known techniques. The particles are capable of being produced with the processing, in which the solid raw materials are mixed together in a predetermined molar ratio, and in which the resulting mixture is subjected to firing processing and grinding processing. As the solid raw materials, it is possible to utilize oxides, such as $GeO_2$, $SiO_2$, $TiO_2$, $Bi_2O_3$, $B_2O_3$, $Al_2O_3$, $Ga_2O_3$, $In_2O_3$, $P_2O_5$, $As_2O_5$, and $Sb_2O_5$. As the formation of a solid solution, a substitutional solid solution with respect to the M element should preferably be formed. The quantity of the solid solution forming element, which is contained in the form of the substitutional solid solution, should preferably fall within the range of 0.02 to 0.4 with respect to M=1 in $Bi_{12}MO_{20}$, and should more preferably fall within the range of 0.05 to 0.15 with respect to M=1 in $Bi_{12}MO_{20}$. For example, in cases where Al is contained in the form of the substitutional solid solution in the quantity of 0.1 with respect to M=1 in $Bi_{12}MO_{20}$, the molar composition is obtained such that Bi:M:Al=12:0.9:0.1. The proportion of Bi, expressed in terms of the Bi/(M+solid solution forming element) molar ratio, should preferably fall within the range between 11.5 and 12.5. When necessary, the mixture having been obtained may be subjected to granulation processing. Thereafter, the resulting granules may be subjected to pressure molding processing at a uniaxial pressure or a hydrostatic pressure falling within the range of approximately 50 MPa to approximately 200 MPa. The firing temperature may fall within the range of 700° C. to 850° C., and should preferably be 800° C. The temperature retaining time may fall within the range of 2 hours to 10 hours, and should preferably be 5 hours. The fired material having been obtained should preferably be single phase $Bi_{12}MO_{20}$ material. In cases where an impurity phase is found to be present, the grinding processing, the molding processing, and the firing processing may be iterated, and the single phase $Bi_{12}MO_{20}$ material may thereby be obtained.

The single phase fired material having been obtained may then be subjected to the grinding processing with a ball mill, or the like, and the single phase $Bi_{12}MO_{20}$ particles, in which the predetermined solid solution forming element has been contained in the form of the solid solution, may thereby be formed. Thereafter, the same procedure as that in the formation of the particles with the liquid phase technique may be performed, and the polycrystal photo-conductor may thereby be obtained.

FIG. 1 is a sectional view showing an embodiment of the radiation detector in accordance with the present invention, in which the photo-conductor having been prepared in the manner described above is employed. With reference to FIG. 1, a radiation detector 1 comprises a photo-conductor 2, and electrodes 3, which are formed on opposite surfaces of the photo-conductor 2. With the radiation detector 1 illustrated in FIG. 1, the radiation having been irradiated to the surface of the electrode 3 is detected by the photo-conductor 2. The thickness of the photo-conductor 2 may be set arbitrarily in accordance with the kind of the radiation to be detected. For example, in cases where X-rays for medical diagnosis are to be detected, the thickness of the photo-conductor 2 should preferably fall within the range of 50 μm to 500 μm. The electrodes 3 may be constituted of an electrically conductive material, such as an indium tin oxide (ITO), Au, or Pt. The electric field applied may fall within the range of 0.1V/μm to 20V/μm, and should preferably fall within the range of 2V/μm to 10V/μm.

The photo-conductor in accordance with the present invention may be employed in a radiation imaging panel for a TFT technique. With the TFT technique, the electric charges having been generated with the irradiation of the radiation are accumulated, and the accumulated electric charges are read through an operation, in which an electric switch, such as a thin film transistor (TFT), is turned on and off with respect to each of pixels. The photo-conductor in accordance with the present invention may also be employed in a radiation imaging panel for an optical read-out technique, in which the read-out operation is performed by use of a radiation image detector utilizing a semiconductor material capable of generating the electric charges when being exposed to light.

Firstly, the TFT type of the radiation imaging panel will be described hereinbelow. FIG. 2 is an explanatory view showing a radiation detecting section and an active matrix array (AMA) board, which are combined together, in an embodiment of the radiation imaging panel in accordance with the present invention.

As illustrated in FIG. 2, the TFT type of the radiation imaging panel has a structure, in which a radiation detecting section 10 and an active matrix array board (AMA board) 20 has been joined together. FIG. 3 is a schematic sectional view showing a constitution at each of radiation detecting sections, each of which corresponds to one pixel. As illustrated in FIG. 3, the radiation detecting section 10 comprises a common electrode 13 for application of a bias voltage. The radiation detecting section 10 also comprises a photo-conductor 14, which is sensitive to the radiation to be detected and forms carriers constituted of electron-hole pairs. The radiation detecting section 10 further comprises a detection electrode 17 for collecting the carriers. The common electrode 13, the photo-conductor 14, and the detection electrode 17 are overlaid in this order from the radiation incidence side. A radiation detecting section support 12 may be located as a top layer on the common electrode 13.

The photo-conductor 14 is the photo-conductor containing $Bi_{12}MO_{20}$ in accordance with the present invention. Each of the common electrode 13 and the detection electrode 17 may be constituted of an electrically conductive material, such as indium tin oxide (ITO), Au, or Pt. In accordance with the polarity of the bias voltage, a hole injection blocking layer or an electron injection blocking layer may be appended to the common electrode 13 or the detection electrode 17.

The constitution of the AMA board 20 will hereinbelow be described briefly. As illustrated in FIG. 4, the AMA board 20 comprises capacitors 21, 21, . . . acting as charge accumulating capacitors and TFT's 22, 22, . . . acting as switching devices. One capacitor 21 and one TFT 22 are located for each of radiation detecting sections 15, 15, . . . , which correspond respectively to the pixels. On the radiation detecting section support 12, in accordance with the necessary pixels, the radiation detecting sections 15, 15, . . . corresponding to the pixels are arrayed in two-dimensional directions in a pattern of a matrix comprising approximately 1,000~3,000 rows×1, 000~3,000 columns. Also, the AMA board 20 comprises the same number of the combinations of the capacitor 21 and the TFT 22 as the number of the pixels are arrayed in two-dimensional directions in the same matrix patter as that described above. The electric charges, which have occurred in the photo-conductor 14, are accumulated in each of the capacitors 21, 21, . . . and act as the electrostatic latent image corresponding to the optical read-out technique. With the TFT technique employed in the present invention, the electrostatic latent image having been formed with the radiation is kept at the charge accumulating capacitors.

The specific constitutions of each of the capacitors 21, 21, . . . and each of the TFT's 22, 22, . . . of the AMA board 20 are illustrated in FIG. 3. Specifically, an AMA board support 23 is constituted of an electrical insulator. A grounding side electrode 21a of the capacitor 21 and a gate electrode 22a of the TFT 22 are formed on the surface of the AMA board support 23. Above the grounding side electrode 21a of the capacitor 21 and the gate electrode 22a of the TFT 22, a connection side electrode 21b of the capacitor 21 is formed via an insulating film 24. Also, above the grounding side electrode 21a of the capacitor 21 and the gate electrode 22a of the TFT 22, a source electrode 22b and a drain electrode 22c of the TFT 22 are formed via the insulating film 24. Further, the top surface of the AMA board 20 is covered with a protective insulating film 25. The connection side electrode 21b of the capacitor 21 and the source electrode 22b of the TFT 22 are connected with each other and are formed together with each other. The insulating film 24 constitutes both the capacitor insulating film of the capacitor 21 and the gate insulating film of the TFT 22. The insulating film 24 may be constituted of, for example, a plasma SiN film. The AMA board 20 may be produced by use of a thin film forming technique or a fine processing technique, which is ordinarily employed for the production of a liquid crystal display board.

The joining of the radiation detecting section 10 and the AMA board 20 will be described hereinbelow. Specifically, the position of the detection electrode 17 and the position of the connection side electrode 21b of the capacitor 21 are matched with each other. In this state, the radiation detecting section 10 and the AMA board 20 are laminated together by adhesion under heating and under pressure with an anisotropic electrically conductive film (ACF) intervening therebetween. The ACF contains electrically conductive particles, such as silver particles, and has the electrical conductivity only in the thickness direction. In this manner, the radiation detecting section 10 and the AMA board 20 are mechanically combined with each other. At the same time, the detection electrode 17 and the connection side electrode 21b are electrically connected with each other by an intervening conductor section 16.

Also, the AMA board 20 is provided with a read-out actuating circuit 26 and a gate actuating circuit 27. FIG. 4 is an electric circuit diagram showing an equivalent circuit of the AMA board. As illustrated in FIG. 4, the read-out actuating circuit 26 is connected to each of read-out wiring lines (read-out address lines) 28, 28, . . . Each of the read-out wiring lines 28, 28, . . . extends in the vertical (Y) direction and connects the drain electrodes 22c, 22c, . . . of the TFT's 22, 22, . . . , which are arrayed along an identical column. The gate actuating circuit 27 is connected to each of read-out wiring lines (gate address lines) 29, 29, . . . Each of the read-out wiring lines 29, 29, . . . extends in the horizontal (X) direction and connects the gate electrodes 22a, 22a, . . . of the TFT's 22, 22, . . . , which are arrayed along an identical row. Though not shown, in the read-out actuating circuit 26, one pre-amplifier (one electric charge-to-voltage converter) is connected to each of the read-out wiring lines 28, 28, . . . In this manner, the AMA board 20 is connected to the read-out actuating circuit 26 and the gate actuating circuit 27. Alternatively, the read-out actuating circuit 26 and the gate actuating circuit 27 may be formed into an integral body within the AMA board 20.

The radiation detecting operations performed by the radiation image recording and read-out system, which comprises the radiation detecting section 10 and the AMA board 20 joined together, are described in, for example, Japanese Unexamined Patent Publication No. 11(1999)-287862.

Figure 5:
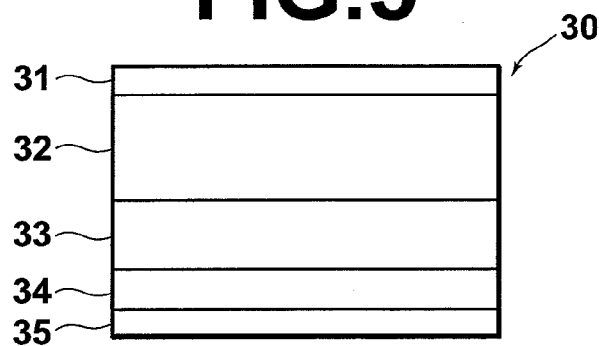
FIG. 5 is a sectional view showing a different embodiment of the radiation imaging panel in accordance with the present invention.

The radiation imaging panel employed for the optical read-out technique will be described hereinbelow. FIG. 5 is a sectional view showing a different embodiment of the radiation imaging panel in accordance with the present invention.

With reference to FIG. 5, a radiation imaging panel 30 comprises a first electrically conductive layer 31, which has transmissivity to recording radiation L1 described later. The radiation imaging panel 30 also comprises a recording radio-conductive layer 32, which exhibits electrical conductivity when it is exposed to the radiation L1 having passed through the first electrically conductive layer 31. The radiation imaging panel 30 further comprises a charge transporting layer 33, which acts approximately as an insulator with respect to electric charges (latent image polarity charges, e.g. negative charges) having a polarity identical with the polarity of electric charges occurring in the first electrically conductive layer 31, and which acts approximately as a conductor with respect to electric charges (transported polarity charges, positive charges in this example) having a polarity opposite to the polarity of the electric charges occurring in the first electrically conductive layer 31. The radiation imaging panel 30 still further comprises a reading photo-conductor 34, which exhibits electrical conductivity when it is exposed to reading light L2 described later, and a second electrically conductive layer 35 having transmissivity to the reading light L2. The first electrically conductive layer 31, the recording radio-conductive layer 32, the charge transporting layer 33, the reading photo-conductor 34, and the second electrically conductive layer 35 are overlaid in this order.

As each of the first electrically conductive layer 31 and the second electrically conductive layer 35, a film of an electrically conductive substance (tin dioxide film, or the like) uniformly coated on a transparent glass plate may be employed.

The charge transporting layer 33 may be constituted of one of various materials, which have the characteristics such that the difference between the mobility of the negative electric charges occurring in the first electrically conductive layer 31 and the mobility of the positive electric charges is large. The charge transporting layer 33 should preferably be constituted of, for example, an organic compound, such as a poly-N-vinylcarbazole (PVK), N,N'-diphenyl-N,N'-bis(3-methylphenyl)-[1,1'-biphenyl]-4,4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl. In particular, the organic compound (PVK, TPD, or the disk-shaped liquid crystal) has light insensitivity and is therefore preferable. Also, since the permittivity is ordinarily low, the capacity of the charge transporting layer 33 and the capacity of the reading photo-conductor 34 become small, and the signal take-out efficiency at the time of readout is capable of being kept high.

The reading photo-conductor 34 should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

As the recording radio-conductive layer 32, the photo-conductor in accordance with the present invention is employed. Specifically, the photo-conductor in accordance with the present invention acts as the recording radio-conductive layer.

The optical read-out technique for reading out the electrostatic latent image will hereinbelow be described briefly.

Figure 6:
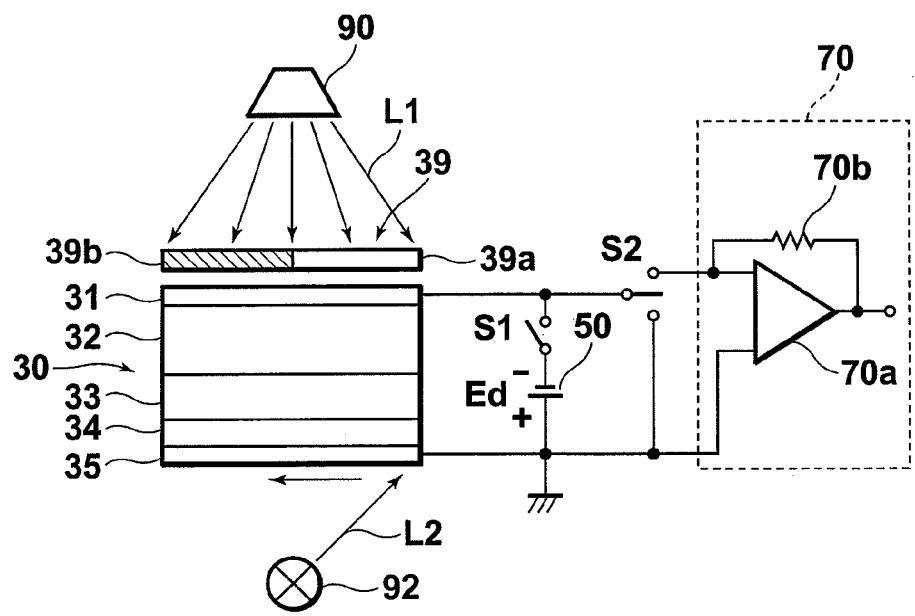
FIG. 6 is a schematic view showing a recording and read-out system, in which the radiation imaging panel of FIG. 5 is employed.

FIG. 6 is a schematic view showing a recording and read-out system (i.e., a combination of an electrostatic latent image recording apparatus and an electrostatic latent image read-out apparatus), in which the radiation imaging panel 30 of FIG. 5 is employed. With reference to FIG. 6, the recording and read-out system comprises the radiation imaging panel 30 and recording irradiation means 90. The recording and read-out system also comprises an electric power source 50 and electric current detecting means 70. The recording and read-out system further comprises read-out exposure means 92, connection means S1, and connection means S2. The electrostatic latent image recording apparatus is constituted of the radiation imaging panel 30, the electric power source 50, the recording irradiation means 90, and the connection means S1.

The electrostatic latent image read-out apparatus is constituted of the radiation imaging panel 30, the electric current detecting means 70, and the connection means S2.

The first electrically conductive layer 31 of the radiation imaging panel 30 is connected via the connection means S1 to a negative pole of the electric power source 50. The first electrically conductive layer 31 of the radiation imaging panel 30 is also connected to one end of the connection means S2. One terminal of the other end of the connection means S2 is connected to the electric current detecting means 70. The second electrically conductive layer 35 of the radiation imaging panel 30, a positive pole of the electric power source 50, and the other terminal of the other end of the connection means S2 are grounded. The electric current detecting means 70 comprises a detection amplifier 70a, which is constituted of an operational amplifier, and a feedback resistor 70b. The electric current detecting means 70 thus constitutes a current-to-voltage converting circuit.

An object 39 is placed at the top surface of the first electrically conductive layer 31. The object 39 has a transmissive region 39a, which has the transmissivity to the radiation L1, and a light blocking region 39b, which does not have the transmissivity to the radiation L1. The recording irradiation means 90 uniformly irradiates the radiation L1 to the object 39. With the read-out exposure means 92, the reading light L2, such as an infrared laser beam, an LED light, or an EL light, is scanned in the direction indicated by the arrow in FIG. 6. The reading light L2 should preferably has a beam shape having been converged into a small beam diameter.

Figure 7A:
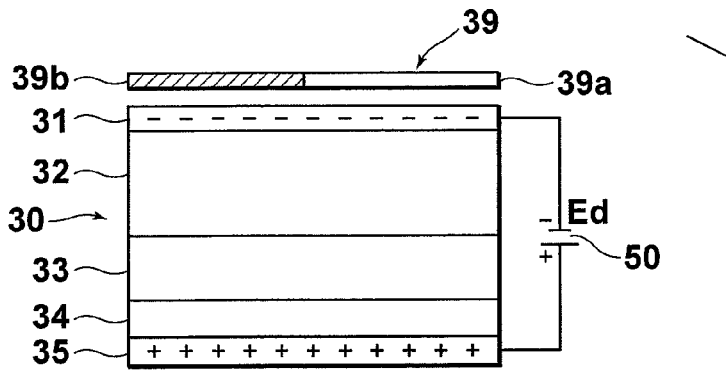
FIGS. 7A to 7D are explanatory views showing electric charge models for explanation of an electrostatic latent image recording stage in the recording and read-out system of FIG. 6, FIGS. 8A to 8D are explanatory views showing electric charge models for explanation of an electrostatic latent image read-out stage in the recording and read-out system of FIG. 6.

An electrostatic latent image recording stage in the recording and read-out system of FIG. 6 will be described hereinbelow with reference to FIGS. 7A to 7D. FIGS. 7A to 7D are explanatory views showing electric charge models for explanation of an electrostatic latent image recording stage in the recording and read-out system of FIG. 6. The connection means S2 illustrated in FIG. 6 is set in an open state (in which the connection means S2 is not connected to the ground nor to the electric current detecting means 70). Also, as illustrated in FIG. 7A, the connection means Si illustrated in FIG. 6 is set in the on state, and a d.c. voltage Ed supplied by the electric power source 50 is applied between the first electrically conductive layer 31 and the second electrically conductive layer 35. As a result, the negative charges occur in the first electrically conductive layer 31, and the positive charges occur in the second electrically conductive layer 35. In this manner, a parallel electric field is formed between the first electrically conductive layer 31 and the second electrically conductive layer 35.

Figure 7B:
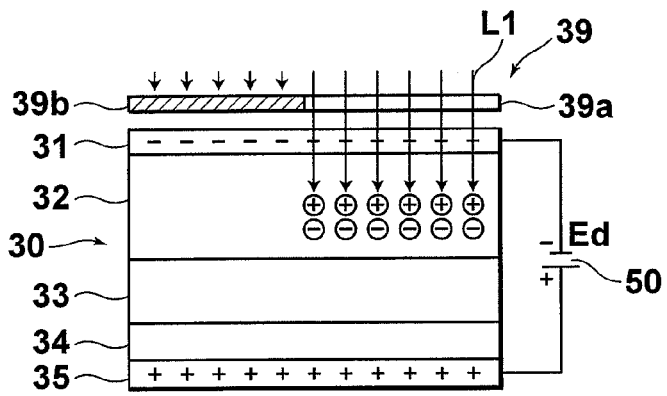

Thereafter, as illustrated in FIG. 7B, the radiation L1 is uniformly irradiated from the recording irradiation means 90 toward the object 39. The radiation L1, which has been produced by the recording irradiation means 90, passes through the transmissive region 39a of the object 39. The radiation L1 then passes through the first electrically conductive layer 31 and impinges upon the recording radio-conductive layer 32. When the recording radio-conductive layer 32 receives the radiation L1 having passed through the first electrically conductive layer 31, the recording radio-conductive layer 32 exhibits the electrical conductivity. The characteristics of the recording radio-conductive layer 32 for exhibiting the electrical conductivity are capable of being found from the characteristics in that the recording radio-conductive layer 32 acts as a variable resistor exhibiting a resistance value variable in accordance with the dose of the radiation L1. The resistance value depends upon the occurrence of electric charge pairs of electrons (negative charges) and holes (positive charges) due to the radiation L1. In cases where the dose of the radiation L1, which has passed through the object 39, is small, a large resistance value is exhibited. In FIG. 7B, the negative charges (−) formed by the radiation L1 are represented by "−" surrounded by the "o" mark, and the positive charges (+) formed by the radiation L1 are represented by "+" surrounded by the "o" mark.

Figure 7C:
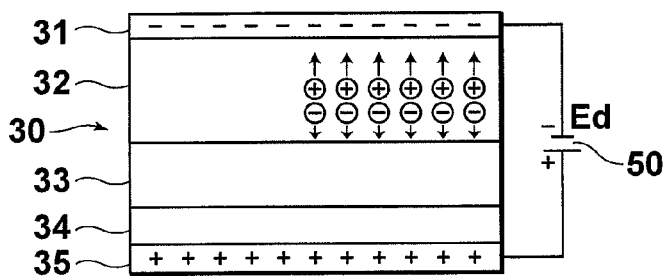
Figure 7D:
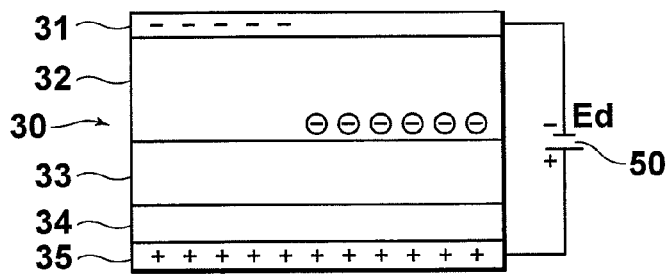

As illustrated in FIG. 7C, the positive charges, which have occurred in the recording radio-conductive layer 32, quickly migrate through the recording radio-conductive layer 32 toward the first electrically conductive layer 31. Also, as illustrated in FIG. 7D, the positive charges, which have migrated through the recording radio-conductive layer 32 toward the first electrically conductive layer 31, undergo charge re-combination with the negative charges, which have been formed in the first electrically conductive layer 31. The charge re-combination occurs at the interface between the first electrically conductive layer 31 and the recording radio-conductive layer 32, and the positive charges described above disappear.

Also, as illustrated in FIG. 7C, the negative charges, which have occurred in the recording radio-conductive layer 32, migrate through the recording radio-conductive layer 32 toward the charge transporting layer 33. The charge transporting layer 33 acts as the insulator with respect to the electric charges (in this example, the negative charges) having the polarity identical with the polarity of the electric charges occurring in the first electrically conductive layer 31. Therefore, as illustrated in FIG. 7D, the negative charges, which have migrated through the recording radio-conductive layer 32 toward the charge transporting layer 33, cease at the interface between the recording radio-conductive layer 32 and the charge transporting layer 33 and are accumulated at the interface between the recording radio-conductive layer 32 and the charge transporting layer 33. The quantity of the electric charges, which are thus accumulated, is defined by the quantity of the negative charges occurring in the recording radio-conductive layer 32, i.e. the dose of the radiation L1 having passed through the object 39.

The radiation L1 does not pass through the light blocking region 39b of the object 39. Therefore, as illustrated in FIGS. 7B, 7C, and 7D, a change does not occur at the region of the radiation imaging panel 30, which region is located under the light blocking region 39b of the object 39. In the manner described above, in cases where the radiation L1 is irradiated to the object 39, electric charges in accordance with the object image are capable of being accumulated at the interface between the recording radio-conductive layer 32 and the charge transporting layer 33. The object image, which is formed with the thus accumulated electric charges, is referred to as the electrostatic latent image.

Figure 8A:
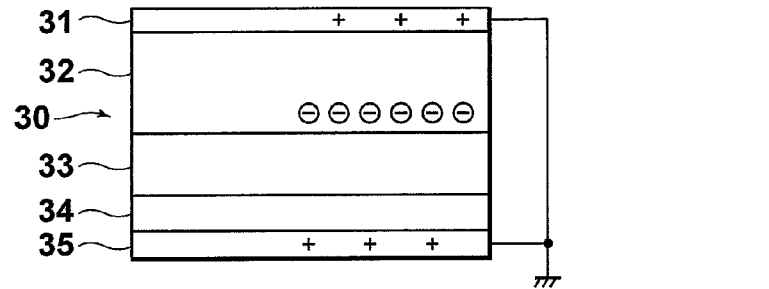

An electrostatic latent image read-out stage in the recording and read-out system of FIG. 6 will be described hereinbelow with reference to FIGS. 8A to 8D. FIGS. 8A to 8D are explanatory views showing electric charge models for explanation of an electrostatic latent image read-out stage in the recording and read-out system of FIG. 6. The connection means S1 illustrated in FIG. 6 is set in the open state, and the supply of the electric power is ceased. Also, as illustrated in FIG. 8A, the connection means S2 illustrated in FIG. 6 is connected to the ground side. In this manner, the first electrically conductive layer 31 and the second electrically conductive layer 35 of the radiation imaging panel 30, on which the electrostatic latent image has been recorded, are set at the identical electric potential, and re-arrangement of the electric charges is performed. Thereafter, the connection means S2 is connected to the side of the electric current detecting means 70.

Figure 8B:
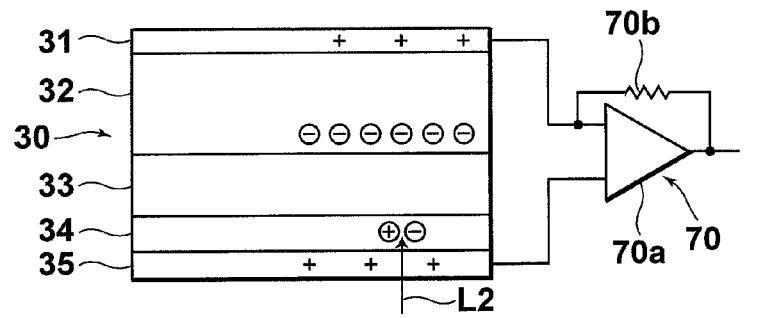

Also, as illustrated in FIG. 8B, with the read-out exposure means 92, the scanning with the reading light L2 is performed from the side of the second electrically conductive layer 35 of the radiation imaging panel 30. The reading light L2 impinging upon the second electrically conductive layer 35 passes through the second electrically conductive layer 35 and impinges upon the reading photo-conductor 34. When the reading photo-conductor 34 is exposed to the reading light L2, which has passed through the second electrically conductive layer 35, the reading photo-conductor 34 exhibits the electrical conductivity in accordance with the scanning exposure. As in the cases of the characteristics of the recording radio-conductive layer 32 for exhibiting the electrical conductivity due to the occurrence of the pairs of the positive and negative charges when the recording radio-conductive layer 32 is exposed to the radiation L1, the characteristics of the reading photo-conductor 34 for exhibiting the electrical conductivity depend upon the occurrence of the pairs of the positive and negative charges when the reading photo-conductor 34 is exposed to the reading light L2. As in the cases of the electrostatic latent image recording stage, in FIG. 8B, the negative charges (−) formed by the reading light L2 are represented by "−" surrounded by the "o" mark, and the positive charges (+) formed by the reading light L2 are represented by "+" surrounded by the "o" mark.

Figure 8C:
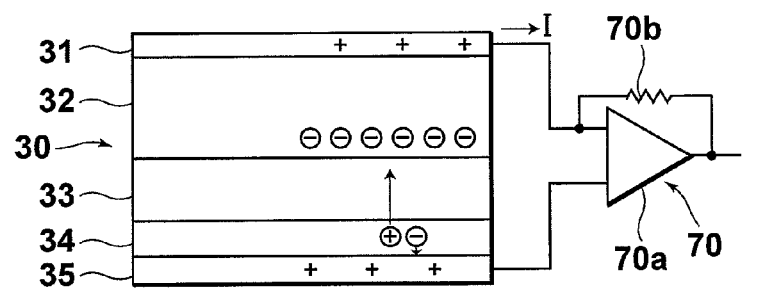
Figure 8D:
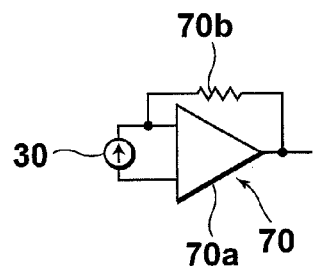

The charge transporting layer 33 acts as the electrical conductor with respect to the positive charges. Therefore, as illustrated in FIG. 8C, the positive charges, which have occurred in the reading photo-conductor 34, quickly migrate through the charge transporting layer 33 by being attracted by the negative charges, which have been accumulated at the interface between the recording radio-conductive layer 32 and the charge transporting layer 33. The positive charges, which have thus migrated through the charge transporting layer 33, undergo the charge re-combination with the accumulated negative charges at the interface between the recording radio-conductive layer 32 and the charge transporting layer 33 and disappear. Also, as illustrated in FIG. 8C, the negative charges, which have occurred in the reading photo-conductor 34, undergo the charge re-combination with the positive charges of the second electrically conductive layer 35 and disappear. The reading photo-conductor 34 is scanned with the reading light L2 having a sufficient optical intensity, and all of the accumulated electric charges, which have been accumulated at the interface between the recording radio-conductive layer 32 and the charge transporting layer 33, i.e. the electrostatic latent image, disappear through the charge re-combination. The disappearance of the electric charges, which have been accumulated in the radiation imaging panel 30, means the state, in which an electric current I flows across the radiation imaging panel 30 due to the migration of the electric charges. The state, in which the electric current I flows across the radiation imaging panel 30 due to the migration of the electric charges, is capable of being represented by an equivalent circuit illustrated in FIG. 8D, in which the radiation imaging panel 30 is represented by the electric current source having the electric current quantity depending upon the quantity of the accumulated electric charges.

As described above, the scanning of the radiation imaging panel 30 with the reading light L2 is performed, and the electric current flowing across the radiation imaging panel 30 is detected. In this manner, the quantity of the accumulated electric charges, which have been accumulated at each of scanned regions (corresponding to pixels), is capable of being detected. The electrostatic latent image is thus capable of being read out. The operations of the radiation detecting section are described in, for example, Japanese Unexamined Patent Publication No. 2000-105297.

The present invention will further be illustrated by the following non-limitative examples.

EXAMPLES

Example 1

Bismuth oxide ($Bi_2O_3$) particles having a purity of 5N and silicon oxide ($SiO_2$) particles having a purity of 5N were mixed together such that a molar ratio might become equal to 6:1. The resulting mixture was thereafter subjected to ball mill mixing processing and was then subjected to preliminary firing processing at a temperature of 800° C. for five hours. In this manner, single phase $Bi_{12}SiO_{20}$ was obtained from the solid phase reaction. The thus obtained $Bi_{12}SiO_{20}$ was then coarsely ground by use of a mortar. The $Bi_{12}SiO_{20}$ particles having thus been obtained were then subjected to grinding processing in ethanol with a ball mill by use of zirconium oxide balls, and the particles having a mean particle diameter of 2 μm were thus obtained. Thereafter, 4 wt % of polyvinyl butyral (PVB) acting as a binder and 0.5 wt % of dioctyl phthalate acting as a plasticizer were added. The resulting mixture was further mixed with ethanol, and a slurry having a viscosity of 60 poise was thereby obtained.

Also, Au was coated to a thickness of 0.1 μm on one surface of an aluminum oxide base plate (thickness: 0.4 mm, purity: 95%). Further, the slurry described above was coated on the surface of the aluminum oxide base plate, which surface had not been coated with Au, by use of a doctor blade technique, such that the coating thickness might be equal to approximately 25 μm. After the coating layer had been dried, the coating layer was subjected to binder removal processing at a temperature of 600° C. for two hours. The coating layer was thereafter subjected to sintering processing at a temperature of 850° C. for two hours. In this manner, the base plate provided with a seed layer was obtained. The thickness of the $Bi_{12}SiO_{20}$ film acting as the seed layer was approximately 10 μm.

As the raw material for the hydrothermal synthesis technique, the $Bi_{12}SiO_{20}$ particles of the same type as that utilized for the preparation of the slurry described above were used. The $Bi_{12}SiO_{20}$ particles were introduced into a platinum cylinder. Further, an aqueous NaOH solution having been adjusted to a concentration of 4N was introduced into the cylinder up to a 80% height of the cylinder. Furthermore, the aluminum oxide base plate provided with the seed layer, which base plate had been prepared in the manner described above, was hung by a platinum wire from a platinum cylinder cover. The aluminum oxide base plate provided with the seed layer was then slowly inserted into the cylinder, such that the entire area of the aluminum oxide base plate provided with the seed layer might be immersed into the upper side of the aqueous NaOH solution contained in the cylinder. The cylinder cover was thus closed. Thereafter, the cylinder was inserted into an autoclave, and a heater controller was adjusted, such that the temperature of the upper side might be kept at 390° C. and such that the temperature of the lower side might be kept at 400° C. The state described above was kept for 20 days. The thickness of the $Bi_{12}SiO_{20}$ polycrystal film, which had been grown with the hydrothermal synthesis technique, was equal to approximately 300 μm.

From the sample having been obtained in the manner described above, the base plate provided with the seed layer was removed by use of a circular disk type polishing machine. Firstly, polishing processing was performed from the side of the aluminum oxide base plate. The aluminum oxide base plate, Au, and $Bi_{12}SiO_{20}$ acting as the seed layer were thus removed, and the surface of the film having been grown with the hydrothermal synthesis technique was thus exposed to the exterior. Also, the surface roughness of the aforesaid surface of the hydrothermal synthesis film was adjusted to be equal to at most 0.1 μm. Further, the opposite surface of the hydrothermal synthesis film was polished. In this manner, a photo-conductor for radiation detection having a total thickness of 200 μm was obtained.

Example 2

Bismuth oxide ($Bi_2O_3$) particles having a purity of 5N, silicon oxide ($SiO_2$) particles having a purity of 5N, and aluminum oxide ($Al_2O_3$) particles having a purity of 5N were mixed together such that a molar ratio might become equal to 6:0.90:0.05. The resulting mixture was thereafter subjected to the ball mill mixing processing and was then subjected to the preliminary firing processing at a temperature of 800° C. for five hours. In this manner, single phase $Bi_{12}Si_{0.9}Al_{0.1}O_{20}$ was obtained from the solid phase reaction. A photo-conductor for radiation detection was obtained in the same manner as that in Example 1, except that the thus obtained particles were used as the raw material for the hydrothermal synthesis technique.

Example 3

Bismuth oxide ($Bi_2O_3$) having a purity of 5N and potassium metasilicate ($K_2SiO_3$) were dissolved in nitric acid. In this manner, a 1N aqueous nitric acid solution, in which the Bi concentration was equal to 1.2 mol/l, and in which the Si concentration was equal to 0.11 mol/l, was prepared as a raw material solution. Also, a 1N aqueous KOH solution was prepared. While 500 ml of the aqueous KOH solution was being stirred, 100 ml of the raw material solution was added dropwise at a rate of 10 ml per minute to the aqueous KOH solution. Thereafter, in the state in which the resulting mixture was being stirred, the temperature of the mixture was raised to 80° C., and was then kept at 80° C. for five hours. The mixture was then cooled to the room temperature. After decantation was performed till the pH value became equal to at most pH8, the precipitate was collected by filtration and dried. In this manner, white particles were obtained. With an X-ray diffraction technique, the particles were identified as being of the $Bi_{12}SiO_{20}$ single phase. The mean particle diameter of the particles was equal to 5 μm.

The thus obtained particles were enclosed in a polyethylene bag and were subjected to hydrostatic pressure processing at a pressure of 200 MPa. The particles were thus formed into a molded material. The molded material having been obtained was subjected to sintering processing at a temperature of 820° C. for two hours. The sample having been sintered was subjected to the polishing processing in the same manner as that in Example 1. In this manner, a photo-conductor for radiation detection having a total thickness of 200 μm was obtained.

Example 4

The particles having been prepared in the same manner as that in Example 3 were formed into a molded material in the same manner as that in Example 3. Thereafter, the molded material was subjected to the hot press sintering processing at a temperature of 810° C. with the application of a surface pressure of 100 MPa in the vertical direction. The sample having been sintered was subjected to the polishing processing in the same manner as that in Example 1. In this manner, a photo-conductor for radiation detection having a total thickness of 200 μm was obtained.

Example 5

White particles were obtained in the same manner as that in Example 3, except that, in lieu of potassium metasilicate being dissolved in the raw material solution, germanium oxide ($GeO_2$) having a purity of 5N was dissolved in the raw material solution, and except that a 1N aqueous nitric acid solution, in which the Bi concentration was equal to 1.2 mol/l, and in which the Ge concentration was equal to 0.11 mol/l, was thus prepared as the raw material solution. The particles having thus been prepared were subjected to the hot press sintering processing at a temperature of 830° C. with the application of a surface pressure of 100 MPa in the same manner as that in Example 4. The sample having been sintered was subjected to the polishing processing in the same manner as that in Example 1. In this manner, a photo-conductor for radiation detection having a total thickness of 200 μm was obtained.

Example 6

A photo-conductor was obtained in the same manner as that in Example 5, except that aluminum hydroxide ($Al(OH)_3$) having a purity of 5N was also dissolved in the raw material solution, and except that a 1N aqueous nitric acid solution, in which the Bi concentration was equal to 1.2 mol/l, in which the Ge concentration was equal to 0.1 mol/l, and in which the Al concentration was equal to 0.01 mol/l, was thus prepared as the raw material solution.

Example 7

A photo-conductor was obtained in the same manner as that in Example 3, except that the $Bi_{12}Si_{0.9}Al_{0.1}O_{20}$ particles, which were of the same type as the $Bi_{12}Si_{0.9}Al_{0.1}O_{20}$ particles having been used as the raw material particles for the hydrothermal synthesis technique in Example 2, were utilized.

Example 8

Bismuth oxide ($Bi_2O_3$) particles having a purity of 5N, silicon oxide ($SiO_2$) particles having a purity of 5N, and aluminum oxide ($Al_2O_3$) particles having a purity of 5N were mixed together such that a molar ratio might become equal to 6:0.98:0.01. The resulting mixture was thereafter subjected to the ball mill mixing processing and was then subjected to the preliminary firing processing at a temperature of 800° C. for five hours. In this manner, single phase $Bi_{12}Si_{0.9}Al_{0.02}O_{20}$ was obtained from the solid phase reaction. A photo-conductor for radiation detection was obtained in the same manner as that in Example 3, except that the thus obtained particles were used as the raw material particles.

Example 9

Bismuth oxide ($Bi_2O_3$) particles having a purity of 5N, silicon oxide ($SiO_2$) particles having a purity of 5N, and aluminum oxide ($Al_2O_3$) particles having a purity of 5N were mixed together such that a molar ratio might become equal to 6:0.60:0.20. The resulting mixture was thereafter subjected to the ball mill mixing processing and was then subjected to the preliminary firing processing at a temperature of 800° C. for five hours. With the X-ray diffraction technique, there was found a heterogeneous phase diffraction line other than the diffraction line corresponding to a sillenite compound of JCPDS No. 370485. Therefore, after the grinding processing was performed, calcination processing was iterated under the same conditions. In this manner, single phase $Bi_{12}Si_{0.6}Al_{0.4}O_{20}$ was obtained. A photo-conductor for radiation detection was obtained in the same manner as that in Example 3, except that the thus obtained particles were used as the raw material particles.

Example 10

Bismuth oxide ($Bi_2O_3$) particles having a purity of 5N, silicon oxide ($SiO_2$) particles having a purity of 5N, and triethyl phosphate ($PO(OC_2H_5)_3$) having a purity of 5N were mixed together such that a molar ratio might become equal to 6:0.90:0.10. The resulting mixture was thereafter subjected to the ball mill mixing processing and was then subjected to the preliminary firing processing at a temperature of 800° C. for five hours. In this manner, single phase $Bi_{12}Si_{0.90}P_{0.10}O_{20}$ was obtained from the solid phase reaction. A photo-conductor for radiation detection was obtained in the same manner as that in Example 3, except that the thus obtained particles were used as the raw material particles.

Example 11

Bismuth oxide ($Bi_2O_3$) particles having a purity of 5N, silicon oxide ($SiO_2$) particles having a purity of 5N, and gallium oxide ($Ga_2O_3$) having a purity of 5N were mixed together such that a molar ratio might become equal to 6:0.90:0.05. The resulting mixture was thereafter subjected to the ball mill mixing processing and was then subjected to the preliminary firing processing at a temperature of 800° C. for five hours. In this manner, single phase $Bi_{12}Si_{0.90}Ga_{0.10}O_{20}$ was obtained from the solid phase reaction. A photo-conductor for radiation detection was obtained in the same manner as that in Example 3, except that the thus obtained particles were used as the raw material particles.

Example 12

Bismuth oxide ($Bi_2O_3$) particles having a purity of 5N, silicon oxide ($SiO_2$) particles having a purity of 5N, and antimony oxide ($Sb_2O_5$) having a purity of 5N were mixed together such that a molar ratio might become equal to 6:0.90:0.05. The resulting mixture was thereafter subjected to the ball mill mixing processing and was then subjected to the preliminary firing processing at a temperature of 800° C. for five hours. In this manner, single phase $Bi_{12}Si_{0.90}Sb_{0.10}O_{20}$ was obtained from the solid phase reaction. A photo-conductor for radiation detection was obtained in the same manner as that in Example 3, except that the thus obtained particles were used as the raw material particles.

Example 13

Bismuth oxide ($Bi_2O_3$) particles having a purity of 5N, germanium oxide ($GeO_2$) having a purity of 5N, and aluminum oxide ($Al_2O_3$) particles having a purity of 5N were mixed together such that a molar ratio might become equal to 6:0.90:0.05. The resulting mixture was thereafter subjected to the ball mill mixing processing and was then subjected to the preliminary firing processing at a temperature of 800° C. for five hours. In this manner, single phase $Bi_{12}Ge_{0.90}Al_{0.10}O_{20}$ was obtained from the solid phase reaction. A photo-conductor for radiation detection was obtained in the same manner as that in Example 3, except that the thus obtained particles were used as the raw material particles, and except that the sintering processing was performed at a temperature of 850° C. for two hours.

Example 14

Bismuth oxide ($Bi_2O_3$) particles having a purity of 5N, titanium oxide ($TiO_2$) having a purity of 5N, and aluminum oxide ($Al_2O_3$) particles having a purity of 5N were mixed together such that a molar ratio might become equal to 6:0.90:0.05. The resulting mixture was thereafter subjected to the ball mill mixing processing and was then subjected to the preliminary firing processing at a temperature of 750° C. for five hours. In this manner, single phase $Bi_{12}Ti_{0.90}Al_{0.10}O_{20}$ was obtained from the solid phase reaction. A photo-conductor for radiation detection was obtained in the same manner as that in Example 3, except that the thus obtained particles were used as the raw material particles, and except that the sintering processing was performed at a temperature of 780° C. for two hours.

Comparative Example 1

A photo-conductor was obtained in the same manner as that in Example 3, except that the $Bi_{12}SiO_{20}$ particles, which were of the same type as the $Bi_{12}SiO_{20}$ particles having been used as the raw material particles for the hydrothermal synthesis technique in Example 1, were utilized.

Comparative Example 2

A photo-conductor was obtained in the same manner as that in Example 4, except that the $Bi_{12}SiO_{20}$ particles, which were of the same type as the $Bi_{12}SiO_{20}$ particles having been used as the raw material particles for the hydrothermal synthesis technique in Example 1, were utilized.

Comparative Example 3

Bismuth oxide ($Bi_2O_3$) particles having a purity of 5N, silicon oxide ($SiO_2$) particles having a purity of 5N, and aluminum oxide ($Al_2O_3$) particles having a purity of 5N were mixed together such that a molar ratio might become equal to 6:0.50:0.25. The resulting mixture was thereafter subjected to the ball mill mixing processing and was then subjected to the preliminary firing processing at a temperature of 800° C. for five hours. With the X-ray diffraction technique, there was found a heterogeneous phase diffraction line other than the diffraction line corresponding to the sillenite compound. Therefore, after the grinding processing was performed, the calcination processing was iterated two times under the same conditions. In this manner, single phase $Bi_{12}Si_{0.5}Al_{0.5}O_{20}$ was obtained. A photo-conductor for radiation detection was obtained in the same manner as that in Example 3, except that the thus obtained particles were used as the raw material particles.

Comparative Example 4

Bismuth oxide ($Bi_2O_3$) particles having a purity of 5N and germanium oxide ($GeO_2$) having a purity of 5N were mixed together such that a molar ratio might become equal to 6:1. The resulting mixture was thereafter subjected to the ball mill mixing processing and was then subjected to the preliminary firing processing at a temperature of 800° C. for five hours. In this manner, single phase $Bi_{12}GeO_{20}$ was obtained from the solid phase reaction. A photo-conductor for radiation detection was obtained in the same manner as that in Example 3, except that the thus obtained particles were used as the raw material particles, and except that the sintering processing was performed at a temperature of 850° C. for two hours.

Comparative Example 5

Bismuth oxide ($Bi_2O_3$) particles having a purity of 5N, germanium oxide ($GeO_2$) having a purity of 5N, and aluminum oxide ($Al_2O_3$) particles having a purity of 5N were mixed together such that a molar ratio might become equal to 6:0.50:0.25. The resulting mixture was thereafter subjected to the ball mill mixing processing and was then subjected to the preliminary firing processing at a temperature of 800° C. for five hours. With the X-ray diffraction technique, there was found a heterogeneous phase diffraction line other than the diffraction line corresponding to the sillenite compound. Therefore, after the grinding processing was performed, the calcination processing was iterated two times under the same conditions. In this manner, single phase $Bi_{12}Ge_{0.5}Al_{0.5}O_{20}$ was obtained. A photo-conductor for radiation detection was obtained in the same manner as that in Example 3, except that the thus obtained particles were used as the raw material particles, and except that the sintering processing was performed at a temperature of 850° C. for two hours.

Comparative Example 6

Bismuth oxide ($Bi_2O_3$) particles having a purity of 5N and titanium oxide ($TiO_2$) having a purity of 5N were mixed together such that a molar ratio might become equal to 6:1. The resulting mixture was thereafter subjected to the ball mill mixing processing and was then subjected to the preliminary firing processing at a temperature of 750° C. for five hours. In this manner, single phase $Bi_{12}TiO_{20}$ was obtained from the solid phase reaction. A photo-conductor for radiation detection was obtained in the same manner as that in Example 3, except that the thus obtained particles were used as the raw material particles, and except that the sintering processing was performed at a temperature of 780° C. for two hours.

Comparative Example 7

Bismuth oxide ($Bi_2O_3$) particles having a purity of 5N, titanium oxide ($TiO_2$) having a purity of 5N, and aluminum oxide ($Al_2O_3$) particles having a purity of 5N were mixed together such that a molar ratio might become equal to 6:0.50:0.25. The resulting mixture was thereafter subjected to the ball mill mixing processing and was then subjected to the preliminary firing processing at a temperature of 750° C. for five hours. With the X-ray diffraction technique, there was found a heterogeneous phase diffraction line other than the diffraction line corresponding to the sillenite compound. Therefore, after the grinding processing was performed, the calcination temperature was altered to 780° C., and the calcination processing was iterated two times. In this manner, single phase $Bi_{12}Ti_{0.5}Al_{0.5}O_{20}$ was obtained. A photo-conductor for radiation detection was obtained in the same manner as that in Example 3, except that the thus obtained particles were used as the raw material particles, and except that the sintering processing was performed at a temperature of 820° C. for two hours.

Comparative Example 8

A $Bi_{12}SiO_{20}$ single crystal, which had been prepared with a Czochralski technique, was cut in the (100) face orientation and polished. In this manner, a photo-conductor having a thickness of 200 μm was obtained.

Comparative Example 9

A $Bi_{12}GeO_{20}$ single crystal, which had been prepared with the Czochralski technique, was cut in the (100) face orientation and polished. In this manner, a photo-conductor having a thickness of 200 μm was obtained.

Comparative Example 10

A $Bi_{12}TiO_{20}$ single crystal, which had been prepared with a Czochralski technique, was cut in the (100) face orientation and polished. In this manner, a photo-conductor having a thickness of 200 μm was obtained.

As for each of the samples of the photo-conductors having been obtained in Examples 1 to 14 and Comparative Examples 1 to 10, the measurements or the calculations of the diffuse reflectivity, the linear absorption coefficient, the sensitivity, and the sensitivity retaining rate were performed in the manner described below.

(Diffuse Reflectivity)

As for the optical measurement, the transmission absorption and diffuse reflection were measured by use of Hitachi U3310 Model provided with a double beam optical system. As for the diffuse reflection spectral measurement, a reflected light integrating sphere was combined with the aforesaid spectroscope, barium sulfate was located on a reference light reflecting plate, and the sample was located on barium sulfate on the sample side. The proportion of the diffuse reflectivity at a wavelength of 450 nm with respect to the diffuse reflectivity at a wavelength of 600 nm was calculated.

Figure 9:
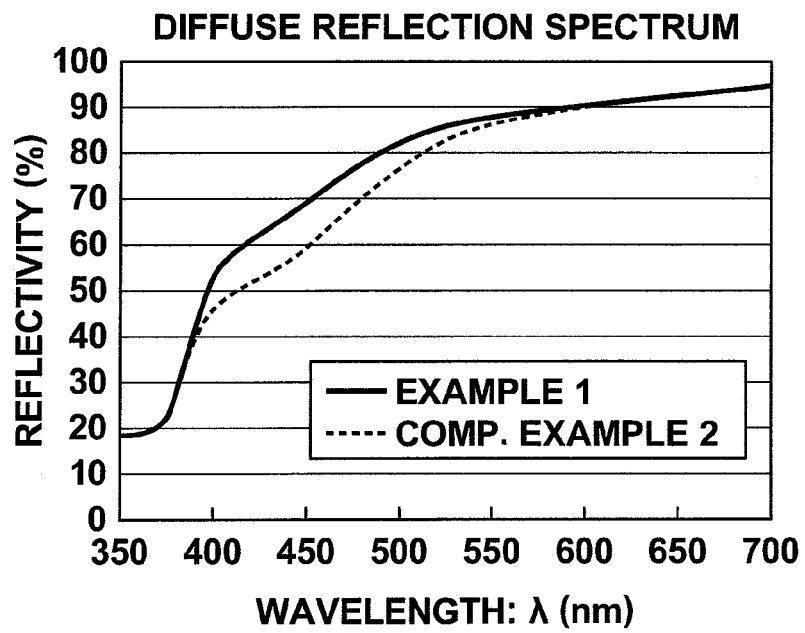
FIG. 9 is a graph showing diffuse reflection spectra of a photo-conductor obtained in Example 1 and a photo-conductor obtained in Comparative Example 2.

By way of example, FIG. 9 shows the diffuse reflection spectrums of the photo-conductor obtained in Example 1 and the photo-conductor obtained in Comparative Example 2. As illustrated in FIG. 9, as for the sample obtained in Example 1, the reflectivity decreases little by little on the wavelength side lower than a wavelength of 550 nm and is kept at an approximately predetermined reflectivity with respect to the wavelength range of at most 385 nm. Also, as for the sample obtained in Example 1, the diffuse reflectivity at a wavelength of 600 nm is equal to 90.6%, and the diffuse reflectivity at a wavelength of 450 nm is equal to 69.0%. Therefore, as for the sample obtained in Example 1, the proportion of the diffuse reflectivity at a wavelength of 450 nm with respect to the diffuse reflectivity at a wavelength of 600 nm is equal to 76.2%. Further, as for the sample obtained in Example 1, the reflectivity with respect to the wavelength range of at least 550 nm is kept at an approximately predetermined value of 90%, which corresponds to the diffuse reflection intensity of the sample with respect to the diffuse reflection intensity of barium sulfate acting as the reference substance. Furthermore, as for the sample obtained in Example 1, with respect to the wavelength range of at most 385 nm, the reflectivity is kept at an approximately predetermined reflectivity of 18% due to irregular reflection from the sample surface.

Also, as illustrated in FIG. 9, as for the sample obtained in Comparative Example 2, the reflectivity decreases little by little on the wavelength side lower than a wavelength of 550 nm. However, as for the sample obtained in Comparative Example 2, the degree of the decrease in reflectivity on the wavelength side lower than a wavelength of 550 nm is higher than the cases of the sample obtained in Example 1. Further, as for the sample obtained in Comparative Example 2, the diffuse reflectivity at a wavelength of 600 nm is equal to 89.7%, and the diffuse reflectivity at a wavelength of 450 nm is equal to 59.4%. Therefore, as for the sample obtained in Comparative Example 2, the proportion of the diffuse reflectivity at a wavelength of 450 nm with respect to the diffuse reflectivity at a wavelength of 600 nm is equal to 66.2%.

(Linear Absorption Coefficient)

The linear absorption coefficient at a wavelength of 450 nm was calculated from the results of the transmission absorption spectral measurement. As the refractive index at a wavelength of 450 nm, the value of 2.73 described in a literature was employed. The linear absorption coefficient was calculated with Formula (2) described above from the absorptivity at a wavelength of 450 nm. Since scattered light was not found, the internal scattering coefficient was taken as being zero.

Figure 10:
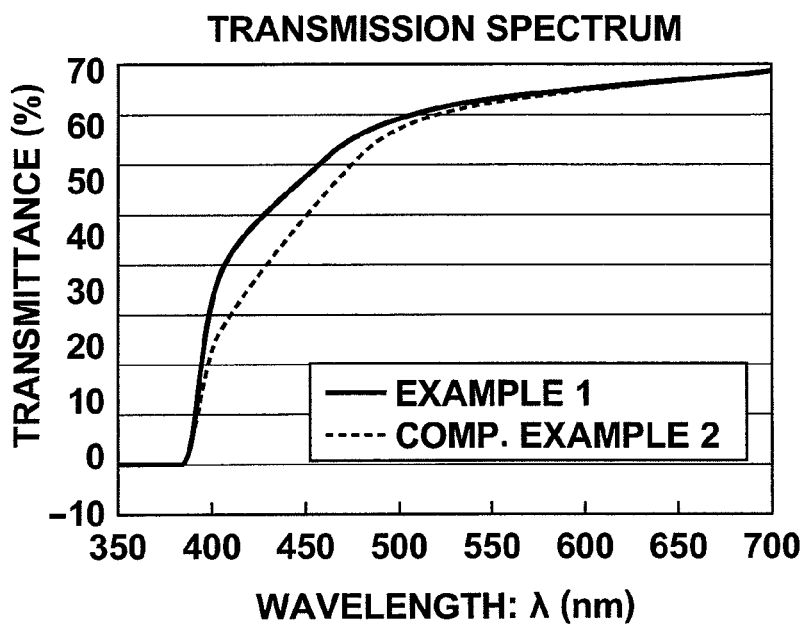
FIG. 10 is a graph showing transmission spectra of the photo-conductor obtained in Example 1 and the photo-conductor obtained in Comparative Example 2.

By way of example, FIG. 10 shows the transmission spectrums of the photo-conductor obtained in Example 1 and the photo-conductor obtained in Comparative Example 2. As illustrated in FIG. 10, as for the sample obtained in Example 1, the transmittance decreases little by little on the wavelength side lower than a wavelength of 550 nm and is kept to be zero with respect to the wavelength range of at most 385 nm. Also, as for the sample obtained in Example 1, the transmittance with respect to a wavelength of 450 nm is equal to 51.0%. From Formula (2) described above and the sample thickness of 200 μm, the linear absorption coefficient at a wavelength of 450 nm is calculated to be 9.5 (/cm). Further, as for the sample obtained in Example 1, the transmittance is kept at an approximately predetermined transmittance of 65% with respect to the wavelength range of at least 550 nm. In cases where refractive index dispersion in accordance with the aforesaid literature is applied, the linear absorption coefficient is calculated to be at most 0.5 (/cm). With respect to the wavelength range of at most 385 nm, which corresponds to at most the optical absorption edge of $Bi_{12}SiO_{20}$, the transmittance becomes equal to zero.

Also, as illustrated in FIG. 10, as for the sample obtained in Comparative Example 2, the transmittance decreases little by little on the wavelength side lower than a wavelength of 550 nm. However, as for the sample obtained in Comparative Example 2, the degree of the decrease in transmittance on the wavelength side lower than a wavelength of 550 nm is higher than the cases of the sample obtained in Example 1. Further, as for the sample obtained in Comparative Example 2, the transmittance at a wavelength of 450 nm is equal to 43.9%. Furthermore, as for the sample obtained in Comparative Example 2, from Formula (2) described above, the linear absorption coefficient at a wavelength of 450 nm is calculated to be 17.0 (/cm).

(Evaluation of Sensitivity)

As for each of the samples of the photo-conductors having been obtained in Examples 1 to 14 and Comparative Examples 1 to 10, an Au electrode having a thickness of 60 nm and a diameter of 10 mm was formed on each of the opposite surfaces of the sample by use of a vacuum evaporation technique, and an X-ray irradiation sample was thereby obtained. Also, a voltage of 500V was applied across the X-ray irradiation sample, and 1 mR (milliroentgen) X-rays (produced by a tungsten tube, under the condition of a voltage of 70 kV, with a 21 mm Al filter being used) were irradiated to the X-ray irradiation sample for 70 millisecond. A photo-current flowing across the two electrodes at this time was converted into a voltage by use of a current amplifier, and the voltage was measured with a digital oscilloscope. In accordance with the obtained current-time wave form, integration was made within the range of the X-ray irradiation time, and the quantity of the collected electric charges per sample area was taken as the sensitivity.

(Sensitivity Retaining Rate)

With respect to each of the X-ray irradiation samples, which had been employed for the evaluation of sensitivity described above, a voltage of 500V was applied across the X-ray irradiation sample, and 300 mR (milliroentgen) X-rays (produced by a tungsten tube, under the condition of a voltage of 80 kV, without an Al filter being used) were irradiated to the X-ray irradiation sample for 700 millisecond. The irradiation was iterated ten times in total at intervals of 15 seconds. A photo-current flowing across the two electrodes at this time was converted into a voltage by use of a current amplifier, and the voltage was measured with a digital oscilloscope. In accordance with the obtained current-time wave form, integration was made within the range of the first X-ray irradiation time, and the quantity of the collected electric charges was calculated. Also, integration was made within the range of the tenth X-ray irradiation time, and the quantity of the collected electric charges was calculated. The percentage of the collected electric charge quantity obtained at the time of the tenth X-ray irradiation with respect to the collected electric charge quantity obtained at the time of the first X-ray irradiation was taken as the sensitivity retaining rate.

The results shown in Table 1 below were obtained. As for the samples provided with no data on the linear absorption coefficient in Table 1, scattered light was found in the transmitted light measurement, and therefore the linear absorption coefficient was not calculated.

TABLE 1

| | Sillenite | Particles | Film forming technique | Element added |
|---|---|---|---|---|
| Example 1 | BSO | — | Hydrothermal technique | — |
| Example 2 | BSO | — | Hydrothermal technique | Al-0.1 |
| Example 3 | BSO | Liquid phase technique | Sintering technique | — |
| Example 4 | BSO | Liquid phase technique | Hot press sintering tech. | — |
| Example 5 | BGO | Liquid phase technique | Hot press sintering tech. | — |
| Example 6 | BGO | Liquid phase technique | Hot press sintering tech. | Al-0.1 |
| Example 7 | BSO | Solid phase technique | Sintering technique | Al-0.1 |
| Example 8 | BSO | Solid phase technique | Sintering technique | Al-0.02 |
| Example 9 | BSO | Solid phase technique | Sintering technique | Al-0.4 |
| Example 10 | BSO | Solid phase technique | Sintering technique | P-0.1 |
| Example 11 | BSO | Solid phase technique | Sintering technique | Ga-0.1 |
| Example 12 | BSO | Solid phase technique | Sintering technique | Sb-0.1 |
| Example 13 | BGO | Solid phase technique | Sintering technique | Al-0.1 |
| Example 14 | BTO | Solid phase technique | Sintering technique | Al-0.1 |

TABLE 1-continued

|  | Proportion (%) of the diffuse reflectivity at a wavelength of 450 nm with respect to the diffuse reflectivity at a wavelength of 600 nm | Linear absorption coefficient (/cm) at a wavelength of 450 nm | Sensitivity (pc/mR · cm$^2$) | Sensitivity retaining rate (%) |
|---|---|---|---|---|
| Example 1 | 76 | 9.5 | 4900 | 96 |
| Example 2 | 82 | 4.5 | 4800 | 97 |
| Example 3 | 79 | — | 4800 | 96 |
| Example 4 | 80 | 6.2 | 4800 | 98 |
| Example 5 | 77 | 8.2 | 3900 | 95 |
| Example 6 | 84 | 3.1 | 4800 | 98 |
| Example 7 | 80 | — | 4500 | 95 |
| Example 8 | 77 | — | 4300 | 93 |
| Example 9 | 75 | — | 3800 | 90 |
| Example 10 | 76 | — | 3600 | 90 |
| Example 11 | 78 | — | 4200 | 93 |
| Example 12 | 77 | — | 3900 | 91 |
| Example 13 | 80 | — | 4300 | 92 |
| Example 14 | 77 | — | 3700 | 90 |

|  | Sillenite | Particles | Film forming technique | Element added |
|---|---|---|---|---|
| Comp. Example 1 | BSO | Solid phase technique | Sintering technique | — |
| Comp. Example 2 | BSO | Solid phase technique | Hot press sintering tech. | — |
| Comp. Example 3 | BSO | Solid phase technique | Sintering technique | Al-0.5 |
| Comp. Example 4 | BGO | Solid phase technique | Sintering technique | — |
| Comp. Example 5 | BGO | Solid phase technique | Sintering technique | Al-0.5 |
| Comp. Example 6 | BTO | Solid phase technique | Sintering technique | — |
| Comp. Example 7 | BTO | Solid phase technique | Sintering technique | Al-0.5 |
| Comp. Example 8 | BSO | Single crystal | — | — |
| Comp. Example 9 | BGO | Single crystal | — | — |
| Comp. Example 10 | BTO | Single crystal | — | — |

|  | Proportion (%) of the diffuse reflectivity at a wavelength of 450 nm with respect to the diffuse reflectivity at a wavelength of 600 nm | Linear absorption coefficient (/cm) at a wavelength of 450 nm | Sensitivity (pc/mR · cm$^2$) | Sensitivity retaining rate (%) |
|---|---|---|---|---|
| Comp. Example 1 | 65 | — | 2800 | 35 |
| Comp. Example 2 | 66 | 17.0 | 2900 | 35 |
| Comp. Example 3 | 69 | — | 3600 | 75 |
| Comp. Example 4 | 70 | — | 2600 | 45 |
| Comp. Example 5 | 73 | — | 3900 | 82 |
| Comp. Example 6 | 60 | — | 2500 | 30 |
| Comp. Example 7 | 68 | — | 3200 | 69 |
| Comp. Example 8 | 72 | 12.5 | 4200 | 63 |
| Comp. Example 9 | 73 | 10.5 | 4800 | 85 |
| Comp. Example 10 | 68 | 15.5 | 3900 | 58 |

As clear from Table 1, as for each of the photo-conductors for radiation detection in accordance with the present invention, which have the characteristics such that the proportion of the diffuse reflectivity at a wavelength of 450 nm with respect to the diffuse reflectivity at a wavelength of 600 nm is equal to at least 75%, or which have the characteristics such that the linear absorption coefficient at a wavelength of 450 nm is equal to at most 10 cm$^{-1}$, the sensitivity retaining rate at the time of the iterated x-ray irradiating operations is equal to at least 90%. Therefore, in cases where the photo-conductor in accordance with the present invention is employed in the X-ray imaging panel for medical diagnoses, it becomes possible to form images free from the ghost or the alteration of gray level gradation contrast. Also, in cases where dynamic images are necessary for the recording position adjustments, and the like, dynamic images exhibiting little residual image formation are capable of being obtained.

Further, each of the samples of the photo-conductors having been obtained in Examples 1 to 14 in accordance with the present invention is the polycrystal and has internal defect structures, such as voids and particle boundaries. However, each of the samples of the photo-conductors in accordance with the present invention has the X-ray detecting sensitivity, which is equivalent to or higher than the X-ray detecting sensitivity of the single crystal of Comparative Examples 8 to 10. Also, each of the samples of the photo-conductors in accordance with the present invention has the high sensitivity retaining rate appropriate for use in practice. Therefore, with the photo-conductor in accordance with the present invention, it becomes possible to produced an X-ray imaging panel having a large area at a low cost, and a high industrial value is capable of being obtained.

What is claimed is:

1. A photo-conductor, which is adapted for use in constituting a radiation detector and which is capable of forming electric charges by being exposed to radiation, the photo-conductor containing $Bi_{12}MO_{20}$, in which M represents at least one kind of element selected from the group consisting of Ge, Si, and Ti, the photo-conductor having characteristics such that a proportion of a diffuse reflectivity at a wavelength of 450 nm with respect to the diffuse reflectivity at a wavelength of 600 nm is equal to at least 75%.

2. A photo-conductor as defined in claim 1 wherein the photo-conductor is a polycrystal.

3. A photo-conductor as defined in claim 1 wherein the photo-conductor has been formed with a hydrothermal synthesis technique.

4. A photo-conductor as defined in claim 1 wherein the photo-conductor has been formed from particles having been formed with a liquid phase technique.

5. A photo-conductor as defined in claim 1 wherein the photo-conductor contains at least one kind of element, which is selected from the group consisting of B, Al, Ga, In, P, As, and Sb, in the form of a solid solution.

6. A photo-conductor as defined in claim 5 wherein the quantity of the at least one kind of the element, which is selected from the group consisting of B, Al, Ga, In, P, As, and Sb, and which is contained in the form of the solid solution, falls within the range of 0.02 to 0.4 with respect to M=1 in $Bi_{12}MO_{20}$.

7. A radiation detector, comprising:
i) a photo-conductor as defined in claim 1, and
ii) electrodes, which are located on opposite sides of the photo-conductor.

8. A radiation imaging panel, comprising:
i) a photo-conductor, from which electric charges having been formed therein are read out by application of an electric field thereto,
ii) a plurality of capacitors for accumulating the electric charges having been formed, which capacitors are arrayed in a planar pattern, and
iii) an electronic circuit for reading out the electric charges, which electronic circuit has been combined with the radiation imaging panel into an integral body,
wherein the photo-conductor is a photo-conductor as defined in claim 1.

9. A radiation imaging panel, comprising:
a photo-conductor, in which electric charges are formed by application of an electric field thereto,
further comprising a charge accumulating layer in which electric charges are accumulated as an electrostatic latent image,
wherein the electric charges are read out by irradiation of light to the radiation imaging panel, and
wherein the photo-conductor is a photo-conductor as defined in claim 1.

* * * * *